US012135664B2

(12) United States Patent
Colenbrander

(10) Patent No.: US 12,135,664 B2
(45) Date of Patent: Nov. 5, 2024

(54) COMPUTE SLED PROVIDING HIGH SPEED STORAGE ACCESS THROUGH A PCI EXPRESS FABRIC BETWEEN COMPUTE NODES AND A STORAGE SERVER

(71) Applicant: Sony Interactive Entertainment Inc., Tokyo (JP)

(72) Inventor: Roelof Roderick Colenbrander, Costa Mesa, CA (US)

(73) Assignee: Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 18/314,693

(22) Filed: May 9, 2023

(65) Prior Publication Data
US 2023/0273889 A1    Aug. 31, 2023

Related U.S. Application Data

(63) Continuation of application No. 17/175,636, filed on Feb. 13, 2021, now Pat. No. 11,645,218.
(Continued)

(51) Int. Cl.
*G06F 13/36* (2006.01)
*G06F 13/16* (2006.01)
(Continued)

(52) U.S. Cl.
CPC ........ *G06F 13/382* (2013.01); *G06F 13/1668* (2013.01); *G06F 13/4022* (2013.01);
(Continued)

(58) Field of Classification Search
CPC .... G06F 13/00; G06F 13/382; G06F 13/1668; G06F 13/4022; G06F 13/4282;
(Continued)

(56) References Cited

U.S. PATENT DOCUMENTS

2006/0218326 A1   9/2006   Tanaka
2008/0148295 A1   6/2008   Freimuth et al.
(Continued)

FOREIGN PATENT DOCUMENTS

WO    WO2019112710 A1    6/2019

OTHER PUBLICATIONS

JP Application No. 2022-549015, Office Action, Jan. 9, 2024, Total 3 pages.

*Primary Examiner* — Henry Tsai
*Assistant Examiner* — Kim T Huynh
(74) *Attorney, Agent, or Firm* — PENILLA IP, APC

(57) ABSTRACT

A network architecture including a streaming array that includes a plurality of compute sleds, wherein each compute sled includes one or more compute nodes. The network architecture including a network storage of the streaming array. The network architecture including a PCIe fabric of the streaming array configured to provide direct access to the network storage from a plurality of compute nodes of the streaming array. The PCIe fabric including one or more array-level PCIe switches, wherein each array-level PCIe switch is communicatively coupled to corresponding compute nodes of corresponding compute sleds and communicatively coupled to the network storage. The network storage is shared by the plurality of compute nodes of the streaming array.

12 Claims, 16 Drawing Sheets

Related U.S. Application Data

(60) Provisional application No. 62/977,138, filed on Feb. 14, 2020.

(51) Int. Cl.
*G06F 13/38* (2006.01)
*G06F 13/40* (2006.01)
*G06F 13/42* (2006.01)
*H04L 49/351* (2022.01)
*H04L 67/1097* (2022.01)

(52) U.S. Cl.
CPC ...... *G06F 13/4221* (2013.01); *G06F 13/4282* (2013.01); *H04L 49/351* (2013.01); *H04L 67/1097* (2013.01); *G06F 2213/0026* (2013.01); *G06F 2213/3808* (2013.01)

(58) Field of Classification Search
CPC ......... G06F 13/4221; G06F 2213/0026; G06F 2213/3808; H04L 49/351; H04L 67/1097
See application file for complete search history.

(56) References Cited

U.S. PATENT DOCUMENTS

| | | | |
|---|---|---|---|
| 2015/0281126 A1* | 10/2015 | Regula | H04L 67/55 709/212 |
| 2017/0102510 A1* | 4/2017 | Faw | H05K 7/1492 |
| 2019/0140838 A1* | 5/2019 | Bernat | H04L 9/3247 |
| 2021/0042255 A1* | 2/2021 | Colenbrander | G06F 3/0659 |

* cited by examiner

COMPUTE SLED PROVIDING HIGH SPEED STORAGE ACCESS THROUGH A PCI EXPRESS FABRIC BETWEEN COMPUTE NODES AND A STORAGE SERVER

CLAIM OF PRIORITY

The present application is a continuation of and claims priority to and the benefit of commonly owned, patent application U.S. Ser. No. 17/175,636, filed on Feb. 13, 2021, entitled "NETWORK ARCHITECTURE PROVIDING HIGH SPEED STORAGE ACCESS THROUGH A PCI EXPRESS FABRIC BETWEEN A COMPUTE NODE TO A STORAGE SERVER"; which claims priority to and the benefit of the commonly owned, provisional patent application, U.S. Ser. No. 62/977,138, filed on Feb. 14, 2020, entitled "NETWORK ARCHITECTURE PROVIDING HIGH SPEED STORAGE ACCESS THROUGH A PCI EXPRESS FABRIC BETWEEN A COMPUTE NODE TO A STORAGE SERVER," the disclosures of which are herein incorporated by reference in their entireties for all purposes.

CROSS REFERENCE TO RELATED APPLICATIONS

The present application is related to U.S. patent application Ser. No. 16/945,635, filed Jul. 31, 2020, entitled "NETWORK ARCHITECTURE PROVIDING HIGH SPEED STORAGE ACCESS THROUGH A PCI EXPRESS FABRIC BETWEEN A COMPUTE NODE TO A STORAGE SERVER," the disclosure of which is herein incorporated by reference in its entirety for all purposes.

TECHNICAL FIELD

The present disclosure is related to network storage, and more specifically for high speed network storage access to compute nodes located on compute sleds of a streaming array of a rack assembly using PCI-Express.

BACKGROUND OF THE DISCLOSURE

In recent years there has been a continual push for online services that allow for online or cloud gaming in a streaming format between a cloud gaming server and a client connected through a network. The streaming format has increasingly become more popular because of the availability of game titles on demand, the ability to execute more complex games, the ability to network between players for multi-player gaming, sharing of assets between players, sharing of instant experiences between players and/or spectators, allowing friends to watch a friend play a video game, having a friend join the on-going game play of a friend, and the like.

Unfortunately, the demand is also pushing up against the limits of the capabilities of network connections. For example, previous generations of streaming network architectures provided network storage using gigabit Ethernet communication connections (e.g., 40 gigabit per second Ethernet connections). However, the new generations of streaming network architectures require better (e.g., faster) bandwidth performance (e.g., Gigabyte connections).

It is in this context that embodiments of the disclosure arise.

SUMMARY

Embodiments of the present disclosure relate to providing high speed access to network storage, such as within a rack assembly, capable of providing greater than 4 Gigabyte per second (GB/s) network storage bandwidth (e.g., access) per compute node.

Embodiments of the present disclosure disclose a network architecture. The network architecture including a streaming array that includes a plurality of compute sleds, wherein each compute sled includes one or more compute nodes. The network architecture including a network storage of the streaming array. The network architecture including a PCIe fabric of the streaming array configured to provide direct access to the network storage from a plurality of compute nodes of the streaming array. The PCIe fabric including one or more array-level PCIe switches, wherein each array-level PCIe switch is communicatively coupled to corresponding compute nodes of corresponding compute sleds and communicatively coupled to the network storage. The network storage is shared by the plurality of compute nodes of the streaming array.

Embodiments of the present disclosure disclose a network architecture. The network architecture including a cluster switch, and a plurality of streaming arrays. A corresponding streaming array includes a plurality of compute sleds, wherein each compute sled includes one or more compute nodes. The corresponding streaming array includes a network storage. The corresponding streaming array includes a PCIe fabric configured to provide direct access to the network storage from a plurality of compute nodes of the corresponding streaming array. The PCIe fabric including at least one array-level PCIe switch, wherein each array-level PCIe switch is communicatively coupled to corresponding compute nodes of corresponding compute sleds and communicatively coupled to the network storage. The network storage is shared by the plurality of compute nodes of the corresponding streaming array. The network architecture including a plurality of network switches coupled to compute nodes of the plurality of streaming arrays, wherein each network switch is configured to provide communications from compute nodes of the corresponding streaming array to the cluster switch.

Embodiments of the present disclosure disclose a network architecture. The network architecture includes network storage. The network architecture includes a plurality of streaming arrays, each streaming array including a plurality of compute sleds, wherein each compute sled includes one or more compute nodes. The network architecture includes a PCI Express (PCIe) fabric configured to provide direct access to the network storage from compute nodes of each of the plurality of streaming arrays. The PCIe fabric includes a plurality of array-level PCIe switches, wherein each array-level PCIe switch being communicatively coupled to compute nodes of compute sleds of a corresponding streaming array and communicatively coupled to the storage server. The network storage is shared by the plurality of streaming arrays.

Embodiments of the present disclosure disclose a network architecture. The network architecture includes network storage. The network architecture includes a plurality of streaming arrays, each streaming array including a plurality of compute sleds, wherein each compute sled includes one or more compute nodes. The network architecture includes a PCI Express (PCIe) fabric configured to provide direct access to the network storage from compute nodes of each of the plurality of streaming arrays. The PCIe fabric includes a plurality of array-level PCIe switches, wherein each array-level PCIe switch being communicatively coupled to compute nodes of compute sleds of a corresponding streaming array and communicatively coupled to the storage server.

The network architecture includes an Ethernet fabric configured to communicatively couple compute nodes of compute sleds of the plurality of streaming arrays to the network storage for purposes of streaming compute sled and compute node management information. The network storage is shared by the plurality of streaming arrays.

Other aspects of the disclosure will become apparent from the following detailed description, taken in conjunction with the accompanying drawings, illustrating by way of example the principles of the disclosure.

BRIEF DESCRIPTION OF THE DRAWINGS

The disclosure may best be understood by reference to the following description taken in conjunction with the accompanying drawings in which.

DETAILED DESCRIPTION

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, embodiments of the present disclosure provide for high speed access to network storage, such as within a rack assembly, which is capable of providing greater than 4 Gigabyte per second (GB/s) network storage bandwidth (e.g., access) per compute node (e.g., of a rack assembly) at non-volatile memory express (NVMe) latencies.

With the above general understanding of the various embodiments, example details of the embodiments will now be described with reference to the various drawings.

Throughout the specification, the reference to "application" or "game" or "video game" or "gaming application" or "game title" is meant to represent any type of interactive application that is directed through execution of input commands. For illustration purposes only, an interactive application includes applications for gaming, word processing, video processing, video game processing, etc. Further, the terms introduced above are interchangeable.

Figure 1:
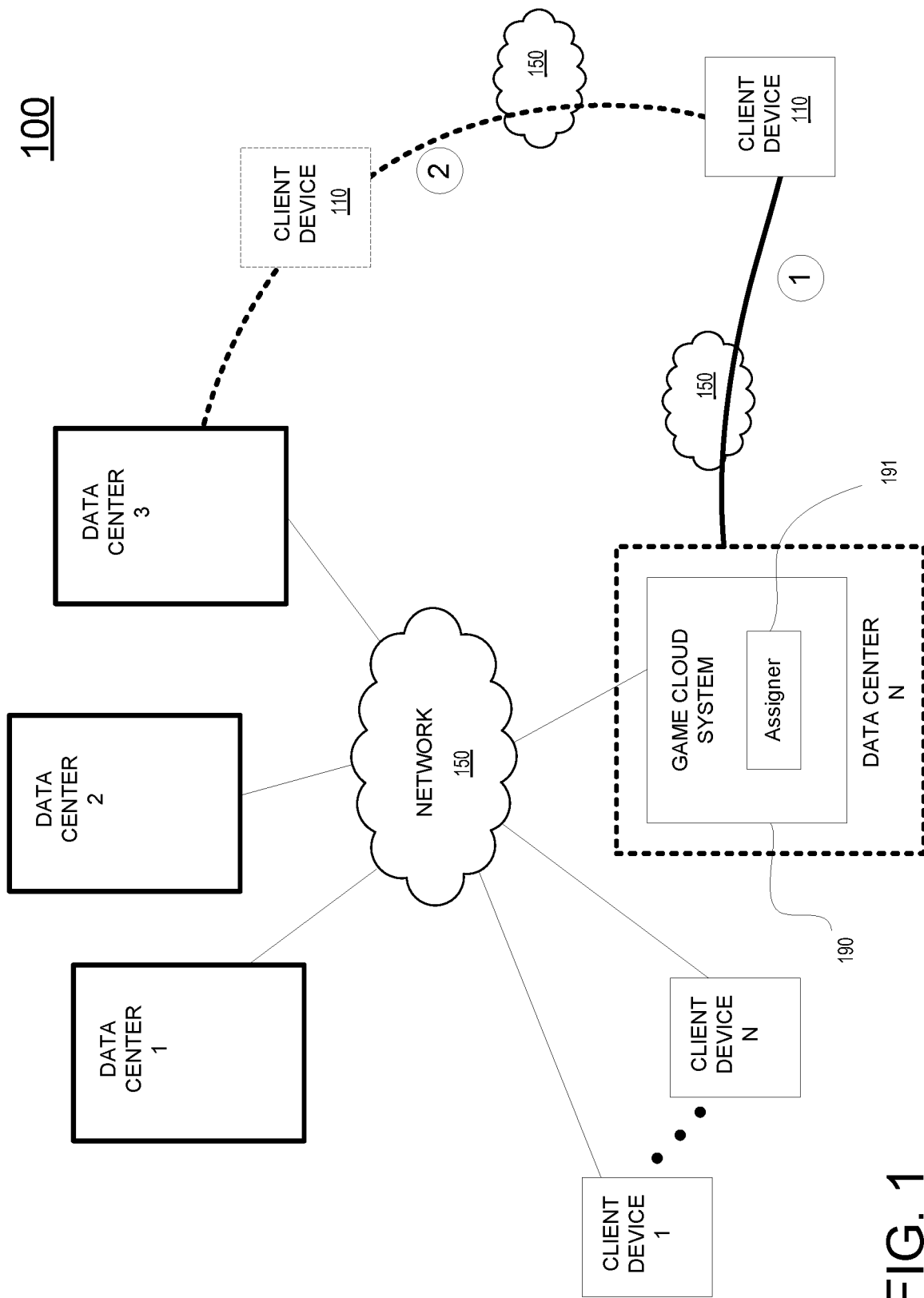
FIG. 1 is a diagram of a game cloud system for providing gaming over a network between one or more compute nodes located at one or more data centers, in accordance with one embodiment of the present disclosure.

FIG. 1 is a diagram of a system 100 for providing gaming over a network 150 between one or more compute nodes located at one or more data centers, in accordance with one embodiment of the present disclosure. The system is configured to provide gaming over a network between one or more cloud gaming servers, and more specifically is configured for high speed access to network storage, such as within a rack assembly, from compute nodes, in accordance with one embodiment of the present disclosure. Cloud gaming includes the execution of a video game at the server to generate game rendered video frames, which are then sent to a client for display.

It is also understood that cloud gaming may be performed using physical machines (e.g., central processing units—CPUs—and graphics processing units—GPU), or virtual machines, or a combination of both, in various embodiments (e.g. in a cloud gaming environment or within a stand-alone system). For example, virtual machines (e.g. instances) may be created using a hypervisor of a host hardware (e.g. located at a data center) utilizing one or more components of a hardware layer, such as multiple CPUs, memory modules, GPUs, network interfaces, communication components, etc. These physical resources may be arranged in racks, such as racks of CPUs, racks of GPUs, racks of memory, etc., wherein the physical resources in the racks may be accessed using top of rack switches facilitating a fabric for assembling and accessing of components used for an instance (e.g. when building the virtualized components of the instance). Generally, a hypervisor can present multiple guest operating systems of multiple instances that are configured with virtual resources. That is, each of the operating systems may be configured with a corresponding set of virtualized resources supported by one or more hardware resources (e.g. located at a corresponding data center). For instance, each operating system may be supported with a virtual CPU, multiple virtual GPUs, virtual memory, virtualized communication components, etc. In addition, a configuration of an instance that may be transferred from one data center to another data center to reduce latency. Instant utilization defined for the user or game can be utilized when saving a user's gaming session. The instant utilization can include any number of configurations described herein to optimize the fast rendering of video frames for a gaming session. In one embodiment, the instant utilization defined for the game or the user can be transferred between data centers as a configurable setting. The ability to transfer the instant utilization setting enables for efficient migration of game play from data center to data center in case the user connects to play games from different geo locations.

System 100 includes a game cloud system 190 as implemented through one or more data centers (e.g., data centers 1 through N). As shown an instance of game cloud system 190 could be located in data center N that provides management functionality, wherein the management functionality of the game cloud system 190 may be distributed through multiple instances of the game cloud system 190 at each of the data centers. In some implementations, the game cloud system management functionality may be located outside of any of the data centers.

That game cloud system 190 includes an assigner 191 that is configured to assign each of the client devices (e.g., 1-N) to corresponding resources in corresponding data centers. In particular, when client device 110 logs into the game cloud system 190, the client device 110 may be connected with an instance of a game cloud system 109 at data center N, wherein data center N may be geographically closest to client device 110. The assigner 191 is able to perform diagnostic testing to determine available transmit and receive bandwidth to the client device 110. Based on the testing, the assigner 191 is able to assign resources to client device 110 with great specificity. For example, the assigner 191 is able to assign a particular data center to the client device 110. In addition, the assigner 191 is able to assign to the client device 110 a particular compute node, of a particular compute sled, of a particular streaming array, of a particular rack assembly. Assignment may be performed based on knowledge of assets (e.g., games) that are available at the compute nodes. Previously, the client device is assigned general to a data center, without further assignment to rack assemblies. In this manner, the assigner 191 is able to assign a client device that is requesting execution of a particular gaming application that is compute intensive to a compute node that may not be running compute intensive applications. In addition, load management of assigning of compute intensive gaming applications as requested by clients may be performed at the assigner 191. For example, the same compute intensive gaming application that is being requested over a short period of time, may be spread across different compute nodes, of different compute sleds in one rack assembly or different rack assemblies to reduce load on a particular compute node, compute sled, and/or rack assembly.

In some embodiments, the assignment may be performed based on machine learning. In particular, resource demand may be predicted for a particular data center, and its corresponding resources. For example, if it can be predicted that a data center will soon be handling many clients running compute intensive gaming applications, then the assigner 191 may assign client device 110 with that knowledge, and assign resource that may not be currently utilizing all of its resource capabilities. In another case, assigner 191 may switch client device 110 from the game cloud system 190 in data center N to resources available in data center 3, in anticipation of increased loading at data center N. In addition, future clients may be assigned to resources in a distributed fashion, such that the load and demand for resources may be distributed throughout the game cloud system, across multiple data centers, across multiple rack assemblies, across multiple compute sleds, and/or across multiple compute nodes. For example, client device 110 may be assigned resources from both game cloud systems on data center N (e.g., over path 1) and data center 3 (e.g., over path 2).

Once the client device 110 is assigned to a particular compute node, of a corresponding compute sled, of a corresponding streaming array, the client device 110 connects to the corresponding data center through the network. That is, the client device 110 may be communicating with a different data center, such as data center 3, than the one performing assignment.

System 100 provides gaming via a game cloud system 190, wherein the game is being executed remote from client device (e.g. thin client) of a corresponding user that is playing the game, in accordance with one embodiment of the present disclosure. System 100 may provide gaming control to one or more users playing one or more games through the cloud game network or game cloud system 190 via network 150 in either single-player or multi-player modes. In some embodiments, the cloud game network or game cloud system 190 may include a plurality of virtual machines (VMs) running on a hypervisor of a host machine, with one or more virtual machines configured to execute a game processor module utilizing the hardware resources available to the hypervisor of the host. Network 150 may include one or more communication technologies. In some embodiments, network 150 may include 5th Generation (5G) network technology having advanced wireless communication systems.

In some embodiments, communication may be facilitated using wireless technologies. Such technologies may include, for example, 5G wireless communication technologies. 5G is the fifth generation of cellular network technology. 5G networks are digital cellular networks, in which the service area covered by providers is divided into small geographical areas called cells. Analog signals representing sounds and images are digitized in the telephone, converted by an analog to digital converter and transmitted as a stream of bits. All the 5G wireless devices in a cell communicate by radio waves with a local antenna array and low power automated transceiver (transmitter and receiver) in the cell, over frequency channels assigned by the transceiver from a pool of frequencies that are reused in other cells. The local antennas are connected with the telephone network and the Internet by a high bandwidth optical fiber or wireless backhaul connection. As in other cell networks, a mobile device crossing from one cell to another is automatically transferred to the new cell. It should be understood that 5G networks are just an example type of communication network, and embodiments of the disclosure may utilize earlier generation wireless or wired communication, as well as later generation wired or wireless technologies that come after 5G.

As shown, the system 100 including game cloud system 190 can provide access to a plurality of gaming applications. In particular, each of the client devices may be requesting access to different gaming applications from the cloud game network. For example, the game cloud system 190 may provide one or more game servers that may be configured as one or more virtual machines executing on one or more hosts to execute a corresponding gaming application. For example, a game server may manage a virtual machine supporting a game processor that instantiates an instance of a gaming application for a user. As such, a plurality of game processors of one or more game servers associated with a plurality of virtual machines is configured to execute multiple instances of one or more gaming applications associated with gameplays of a plurality of users. In that manner, back-end server support provides streaming of media (e.g. video, audio, etc.) of gameplays of a plurality of gaming applications to a plurality of corresponding users. That is, a game server of the game cloud system 190 is configured to stream data (e.g. rendered images and/or frames of a corresponding gameplay) back to a corresponding client device through network 150. In that manner, a computationally complex gaming application may be executing at the back-end server in response to controller inputs received and forwarded by client device. Each server is able to render images and/or frames that are then encoded (e.g. compressed) and streamed to the corresponding client device for display.

In one embodiment, cloud game network or game cloud system 190 is a distributed game server system and/or architecture. In particular, a distributed game engine executing game logic is configured as a corresponding instance of a corresponding gaming application. In general, the distributed game engine takes each of the functions of a game engine and distributes those functions for execution by a multitude of processing entities. Individual functions can be further distributed across one or more processing entities. The processing entities may be configured in different configurations, including physical hardware, and/or as virtual components or virtual machines, and/or as virtual containers, wherein a container is different from a virtual machine as it virtualizes an instance of the gaming application running on a virtualized operating system. The processing entities may utilize and/or rely on servers and their underlying hardware on one or more servers (compute nodes) of the cloud game network or game cloud system 190, wherein the servers may be located on one or more racks. The coordination, assignment, and management of the execution of those functions to the various processing entities are performed by a distribution synchronization layer. In that manner, execution of those functions is controlled by the distribution synchronization layer to enable generation of media (e.g. video frames, audio, etc.) for the gaming application in response to controller input by a player. The distribution synchronization layer is able to efficiently execute (e.g. through load balancing) those functions across the distributed processing entities, such that critical game engine components/functions are distributed and reassembled for more efficient processing.

Figure 2A:
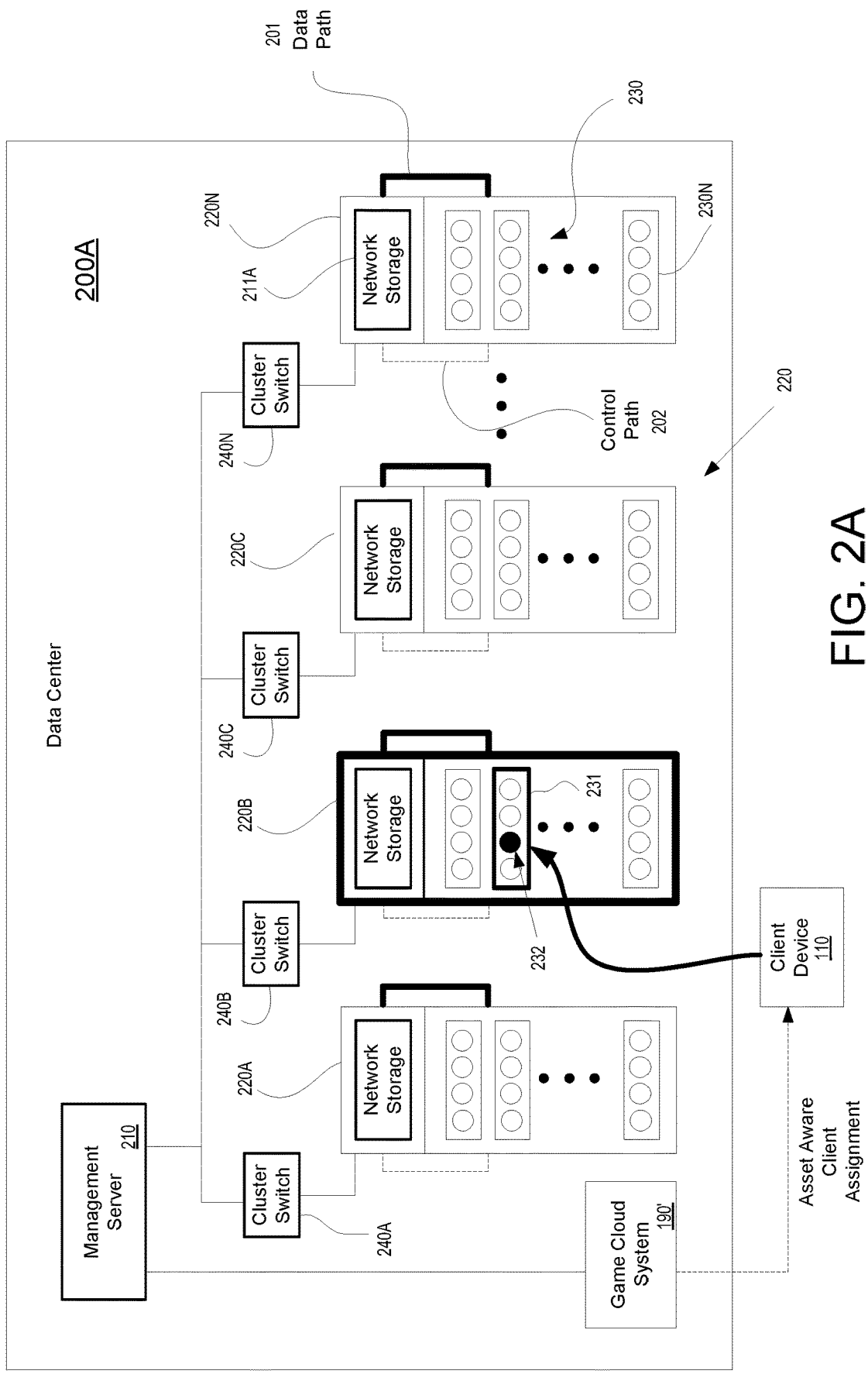
FIG. 2A is a diagram of a plurality of rack assemblies including a plurality of compute nodes at a representative data center of a game cloud system, in accordance with one embodiment of the present disclosure.

FIG. 2A is a diagram of a plurality of rack assemblies 210 including a plurality of compute nodes at a representative data center 200A of a game cloud system, in accordance with one embodiment of the present disclosure. For example, multiple data centers may be distributed throughout the world, such as in North America, Europe and Japan.

The data center 200 includes a plurality of rack assemblies 220 (e.g., rack assemblies 220A through 220N). Each of the rack assemblies includes corresponding network storage and a plurality of compute sleds. For example, representative rack assembly 220N includes network storage 211A and a plurality of compute sleds 230 (e.g., sleds 230A through 230N). Other rack assemblies may be similarly configured with or without modification. In particular, each of the compute sleds includes one or more compute nodes providing hardware resources (e.g., processors, CPUs, GPUs, etc.). For example, compute sled 230N in the plurality of compute sleds 230 of rack assembly 220N is shown to include four compute nodes, though it is understood that the rack assembly may include one or more compute nodes. Each rack assembly is coupled to a cluster switch that is configured to provide communication with a management server that is configured for management of the corresponding data center. For example, rack assembly 220N is coupled to cluster switch 240N. The cluster switch also provides communication to external communication networks (e.g., internet, etc.).

Each rack assembly provides high speed access to corresponding network storage, such as within a rack assembly. This high speed access is provided over a PCIe fabric which provides direct access between a compute node and the corresponding network storage. For example, in rack assembly 220N the high speed access is configured to provide a data path 201 between a particular compute node of a corresponding compute sled to a corresponding network storage (e.g., storage 211A). In particular, the PCIe fabric is capable of providing greater than 4 Gigabyte per second (GB/s) network storage bandwidth (e.g., access) per compute node (e.g., of a rack assembly) at non-volatile memory express (NVMe) latencies. Also, a control path 202 is configured for communicating control and/or management information between the network storage 210 and each of the compute nodes.

As shown, the management server 210 of the data center 200 communicates with the assigner 191 (shown in FIG. 1) to assign resources to client device 110. In particular, management server 210 may work with an instance of the game cloud system 190' and in conjunction with the initial instance of the game cloud system 190 (e.g., of FIG. 1) to assign resources to client device 110. In embodiments, the assignment is performed based on asset awareness, such as knowing what resources and bandwidth are required and that exist at the data center. As such, embodiments of the present disclosure are configured to assign client device 110 to a particular compute node 232 of a corresponding compute sled 231 of a corresponding rack assembly 220B, for illustration.

The streaming rack assemblies are centered around compute nodes, which run gaming applications, video games and/or stream the audio/video of a game session to a one or more clients. Further, within each rack assembly, game content may be stored on a storage server providing network storage. The network storage is equipped with a large amount of storage and high-speed networking to serve many compute nodes by means of network file system (NFS) based network storage.

Figure 2B:
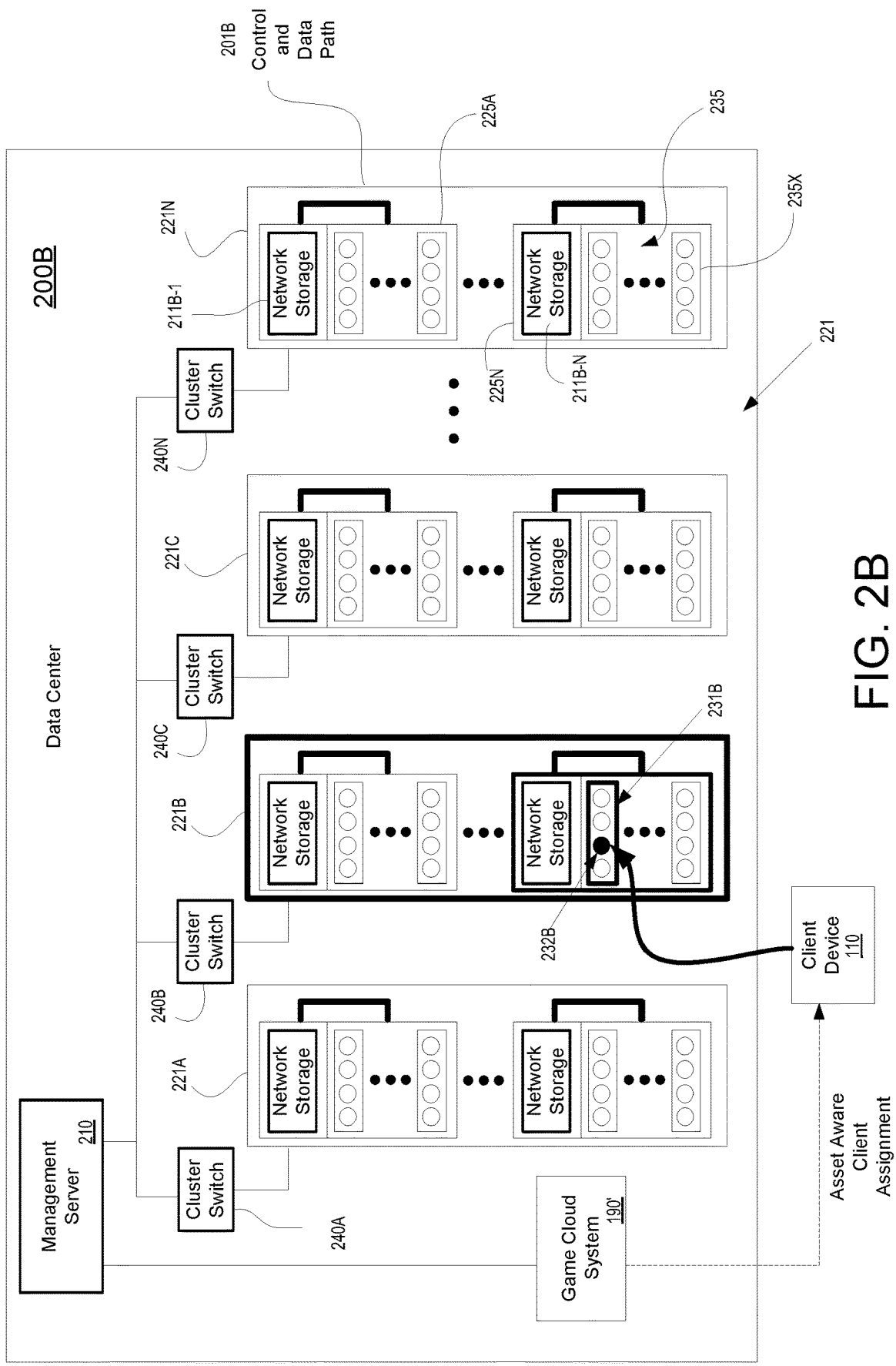
FIG. 2B is a diagram of a plurality of rack assemblies including a plurality of compute nodes at a representative data center of a game cloud system, wherein each network storage is accessible by a corresponding array of compute nodes, in accordance with one embodiment of the present disclosure.

FIG. 2B is a diagram of a plurality of rack assemblies 221 including a plurality of compute nodes at a representative data center 200B of a game cloud system, wherein each network storage is accessible by a corresponding array of compute nodes, in accordance with one embodiment of the present disclosure. Data center 200B is similar to data center 200A, wherein like numbered components have similar functionality. However, data center 200B has a different configuration of rack assemblies than the rack assemblies in data center 200A, such that network storage is accessed by compute nodes of a single streaming array, as will be described below.

The data center 200 includes a plurality of rack assemblies 221 (e.g., rack assemblies 221A through 221N). Each of the rack assemblies includes one or more streaming arrays, wherein each streaming array includes a corresponding network storage and a plurality of compute sleds. For example, representative rack assembly 221N includes streaming arrays 225A through 225N. In one embodiment, rack assembly 221N includes two streaming arrays, wherein each streaming array includes network storage and a plurality of compute sleds. For example, streaming array 225N includes a plurality of compute sleds 235 accessing a network storage 211B-N. In particular, each of the compute sleds includes one or more compute nodes providing hardware resources (e.g., processors, CPUs, GPUs, etc.). For example, compute sled 235X of streaming array 225N is shown to include four compute nodes, though it is understood that the rack assembly may include one or more compute nodes.

Each rack assembly is coupled to a cluster switch that is configured to provide communication with a management server that is configured for management of the corresponding data center, as previously described. For example, rack assembly 221N is coupled to cluster switch 240N. The cluster switch also provides communication to other rack assemblies (e.g., via corresponding cluster switches, and to external communication networks (e.g., internet, etc.).

Each streaming array of a corresponding rack assembly provides high speed access to corresponding network storage, as previously described. This high speed access is provided over a PCIe fabric which provides direct access between a compute node and the corresponding network storage. Compute nodes may run gaming applications and stream the audio/video of a game session to one or more clients, wherein a corresponding network storage (e.g., storage server) holds the gaming application, game data, and user data. For example, in streaming array 225N of rack assembly 221N the high speed access is configured to provide a data and control path 201B between a particular compute node of a corresponding compute sled to a corresponding network storage (e.g., storage 211B-N). Also, path 201B is configured for communicating control and/or management information between the network storage 211B-N and each of the compute nodes in streaming array 225N.

As previously described, management server 210 of data center 200B communicates with the assigner 191 to assign resources to client device 110 in support of game cloud system 190' and/or 190. In embodiments, the assignment is performed based on asset awareness, such as knowing what resources and bandwidth are required and that exist at the data center. As such, embodiments of the present disclosure are configured to assign client device 110 to a particular compute node 232B of a corresponding compute sled 231B of a corresponding streaming array of a rack assembly 221B, for illustration.

Figure 2C:
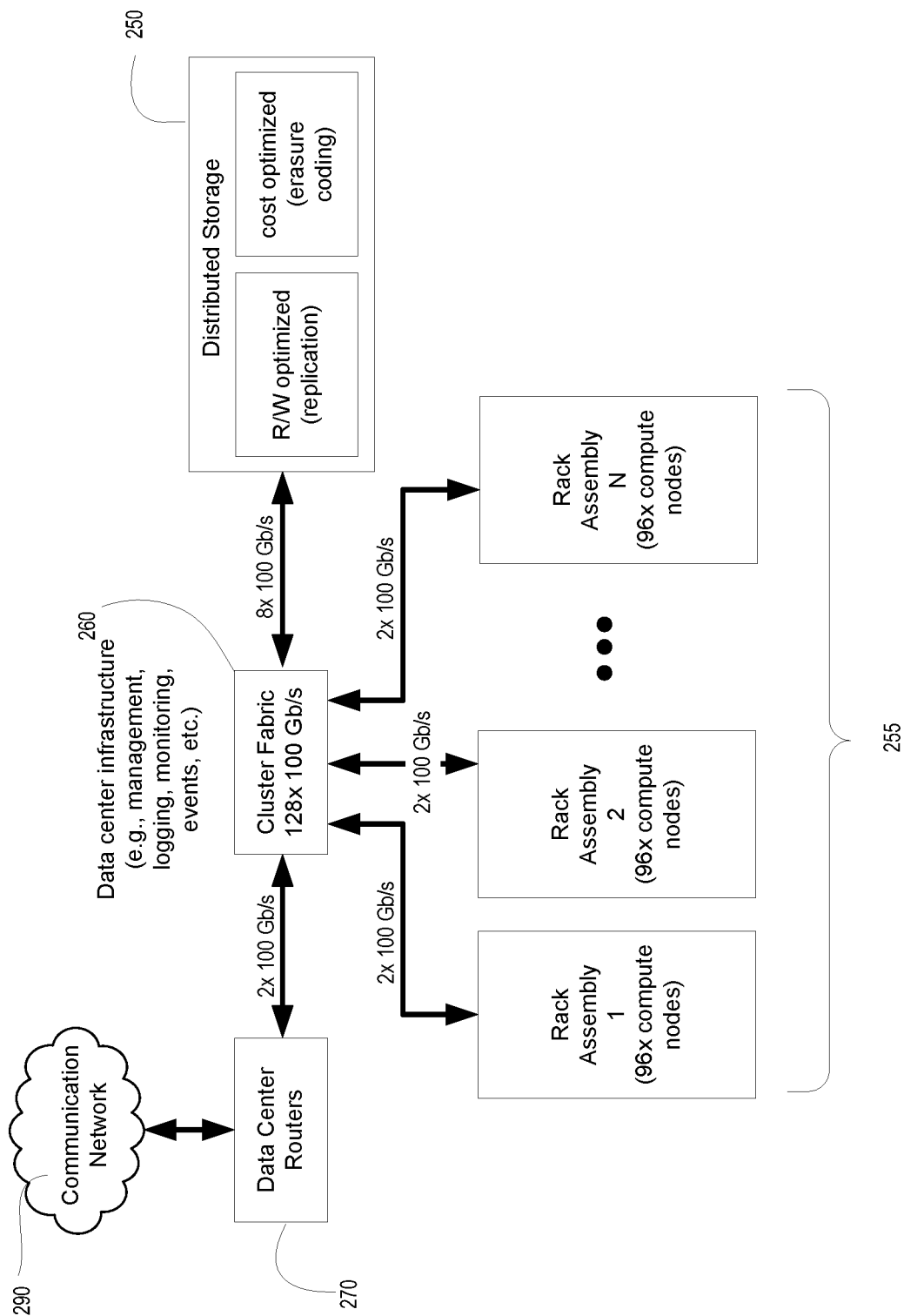
FIG. 2C is a diagram of a cluster of rack assemblies at a representative data center of a game cloud system, in accordance with one embodiment of the present disclosure.

FIG. 2C is a diagram of a system 200C including a cluster 255 of rack assemblies at a representative data center of a game cloud system, in accordance with one embodiment of the present disclosure. The configuration of rack assemblies in the cluster 255 depends on design choice, wherein different configurations are described throughout the specification, and as shown in FIGS. 2A-2B, 3A, and 4A-4B. In one embodiment, the cluster 255 includes fifty rack assemblies. In other embodiments, cluster 255 may include more than or less than fifty rack assemblies depending on design choice. For purposes of illustration only, a rack assembly may include 96× compute nodes, wherein a rack assembly includes two streaming arrays with 48× compute nodes per streaming array as described in FIGS. 2B and 4A (though other configurations of rack assemblies are supported, such as those described in FIGS. 2A and 3A). As such, the cluster 255 may include 4800 compute nodes. Further, if each compute node supports at least 10 users, then the cluster 255 may support at least 48,000 users.

Each of the rack assemblies in the cluster 255 is communicatively coupled to a cluster fabric/switch 260 (e.g., including a cluster switch) over redundant pair of channels or lanes (e.g., Ethernet lanes supporting at least 100 gigabits per second). That is, the cluster fabric 260 provides communications between rack assemblies in one or more clusters, distributed storage 250, and a communication network 290. Cluster fabric/switch also provides data center supports services, such as management, logging, monitoring, event generation, etc. Cluster fabric/switch 260 provides communication to an external communication network via a router system 270 and a communication network 290 (e.g., internet). Also, cluster fabric/switch 260 provides communication to distributed storage 250, which is further described below (e.g., 8 channels of 100 gigabits per second).

The distributed storage 250 provides centralized storing of user data, game data, and game packages that is accessible by compute nodes of each of the clusters 255 of rack assemblies. Distributed storage 250 is scalable such that servers may be added or removed depending on demand, and wherein the storage 250 is able to redistribute and/or reconfigure itself. In addition, distributed storage is configured to provide load balancing, such that data is stored in small chunks across multiple storage servers. Management of the distributed storage can be performed through user interfaces.

In particular, distributed storage 250 may be configured to store a full complement of game titles (e.g., gaming applications) for a game cloud system 190 (e.g., approximately 200 terabytes [TB] of storage for storing the full catalog of gaming applications). Distributed storage 250 may also be configured to store user and game data for the users of the game cloud system 190. User and game data may include user save data, suspend/resume data for corresponding gaming applications, download data, and others (e.g., imaging, photos, etc.). For purposes of illustration, each user may require approximately 50 gigabytes (GB) of storage for each user. In one embodiment, distributed storage 250 stores of suspend/resume information associated with corresponding game titles (e.g., 8 gigabytes per game title).

Each streaming array and/or network storage per streaming array caches game packages that users are playing within a rack assembly, wherein one or more streaming arrays are located in a rack assembly. The stored game packages may be striped across different storage drives for load balancing drives and individual memory components in the network storage. Also, different drives may be used to begin storing different game packages. As an illustration, data may be stored across multiple disks using redundant array of inexpensive disk (RAID) storage technology. For example, popular titles should be available at each of the streaming arrays, and over all the rack assemblies. That is, each streaming array has a subset of the complete catalog of game titles and/or game packages. When a user requests a game title that is not (e.g., "cache miss") on the corresponding rack assembly, the corresponding rack assembly with the compute node supporting the user will call for the game title to be transferred from distributed storage 250 (or data center storage) to the rack assembly during a gaming session. Deciding which game titles are to be stored in network storage for a corresponding streaming array may be performed based on machine learning. For example, machine learning can be used to determine which games are popular, and which games are less frequently accessed at particular moments in time. In that manner, loading of game titles may be minimized for the game titles that are accessed at a particular streaming array.

Figure 3A:
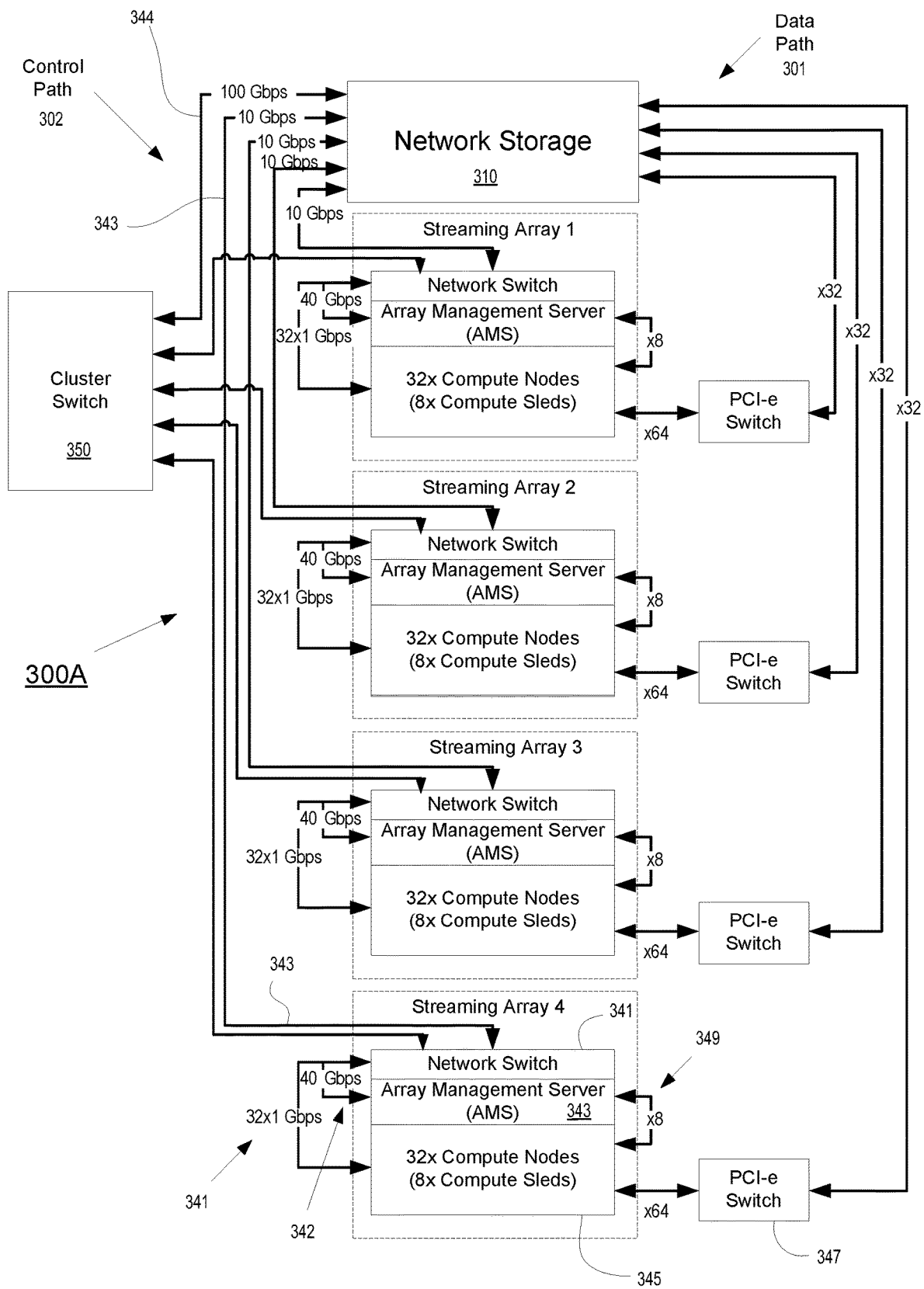
FIG. 3A is a diagram of a rack assembly configured for providing high speed access to network storage to compute nodes using PCIe communications, wherein the network storage is accessible by one or more arrays of compute nodes, in accordance with one embodiment of the present disclosure.

FIG. 3A is a diagram of a rack assembly 300A configured for providing high speed access to network storage to compute nodes using PCIe communications, wherein network storage is accessed by one or more streaming arrays in a corresponding rack assembly, in accordance with one embodiment of the present disclosure. As shown, the diagram of FIG. 3A shows a high-level rack design for the rack assembly 300A. Rack assembly 300A may be representative of one or more of the plurality of rack assemblies 220 of FIG. 2A. For example, rack assembly 300A may be representative of rack assembly 220N.

As previously described, traditional rack design provided access to network storage using Gigabit Ethernet. That is access to network storage provided 40 gb/s bandwidth access, which is not feasible for future gaming. In particular, embodiments of the present disclosure provides for access to network storage at greater than approximately 4 gigabytes per second (GB/s) bandwidth per compute node at NVMe level latencies. This is achieved through PCI Express switching technology and a rack-wide PCI Express fabric, in one embodiment.

Each rack assembly 300A includes a network storage 310. Game content is stored on the network storage 310 within each rack assembly. The network storage 310 is equipped with a large amount of storage and high-speed networking to serve many compute nodes by means of NFS based network storage.

In addition, each rack assembly 300A includes one or more streaming arrays. Though the rack assembly 300A is shown as having four arrays, it is understood that one or more streaming arrays may be included within the rack assembly 300A. More particularly, each streaming array includes a network switch, an array management server (AMS), and one or more compute sleds. For example, representative streaming array 4 includes network switch 341, AMS 343, and one or more compute sleds 345. The other streaming arrays 1-3 may be similarly configured. The streaming arrays shown in FIG. 3A include eight compute sleds per streaming array for purposes of illustration, and it is understood that a streaming array can include any number of compute sleds, such that each compute sled includes one or more compute nodes.

In particular, each streaming array is serviced by a corresponding PCIe switch that is configured part of a PCIe fabric (e.g., Gen4) providing direct access between compute nodes and a storage server through the PCIe fabric. For example, representative streaming array 4 is serviced by PCIe switch 347. The PCIe fabric (i.e., including PCIe switches servicing each of the streaming arrays 1-4) provides a data path 301 (e.g., data path 201 in rack assembly 220N) that allows high speed access to game data stored in network storage 310, as previously described.

In addition, each streaming array is configured with an Ethernet fabric that provides a control path 302 (e.g., control path 202 in rack assembly 220N), such as for communicating control and/or management information to the streaming arrays.

Also, the rack assembly 300A is configured with shared power as managed by a rack management controller (not shown). In addition, the rack assembly may be configured with shared cooling (not shown).

The rack assembly 300A is designed around the requirement to provide high-speed storage access (e.g., at up to or greater than 4-5 GB/s) to each compute node. Storage is provided by a network storage 310, which stores game content in RAM and on NVMe drives (i.e., not a conventional just a bunch of disks—JBOD—storage server). In one embodiment, the game content is "read-only," and as such can thus be shared among systems. Individual compute nodes access the game content at the network storage 310 through a PCIe fabric (e.g., providing data path 301) between each of the streaming arrays and the network storage 310.

In particular, the PCIe fabric (e.g., Gen4) may assume that not all compute nodes need peak performance (4-5 GB/s) at the same time. Each sled has multiple lanes (e.g., 8) lanes of PCIe (e.g., up to 16 GB/s). For example, a total of 64 lanes (for 8 sleds) per streaming array is provided to the corresponding PCIe switch, which may be configured as having a multi lane (e.g., 96-lane) PCIe switch. However, each PCIe switch may only provide corresponding arrays 32 lanes to the network storage 310, depending on the design.

In addition, each rack assembly 300A includes a second PCIe fabric available between an array management server (AMS) and corresponding compute sleds. For example, array 4 includes a second PCIe fabric 349 providing communication between the AMS 343 and the one or more compute sleds 345. This fabric is lower performance (e.g., 1 lane of PCIe per sled), and may be used for lower-speed storage workloads and for sled management purposes.

In addition, each rack assembly 300A includes a conventional Ethernet network, such as to provide communications for the control path 302. For example, each compute node has 1×1 Gbps Ethernet (e.g., 32×1 Gbps in an Ethernet fabric 341 for 32 compute nodes between the compute nodes and a corresponding network switch), which is used for "streaming audio/video" and management. The AMS and network storage have faster networking (e.g., 40 Gbps between a corresponding AMS and network switch (e.g., path 342), 10 Gbps between network storage 310 and a corresponding network switch (e.g., path 343), and 100 Gbps between network storage 310 and a cluster switch 350 (path 344), for example for network storage and management purposes.

Network storage 310 (e.g., server) may also be configured to provide network storage access to AMS servers and compute nodes of one or more streaming arrays in a rack assembly. Network storage access to AMS servers is handled over conventional Ethernet networking (e.g., 10 Gbps between a corresponding network switch and the network storage 310). However, network storage to compute nodes is done over PCI Express by means of a custom protocol and custom storage solution (i.e., via data path 301). The background for this custom storage solution lies in the hardware and software design for the compute nodes, which utilizes PCIe switching.

Each compute node may use a "command buffer" based protocol to request data from a location, in one embodiment. The network storage 310 is expected to locate the data. In particular, the compute node will use a direct memory access (DMA) engine to move into its own memory during a "read operation". Data stored on the network storage 310 is stored in RAM and NVMe. Software on the network storage 310 will ensure data is cached in RAM where possible to avoid having to retrieve data from NVMe. Many compute nodes are expected to access the same content, so caching is feasible.

Figure 3B:
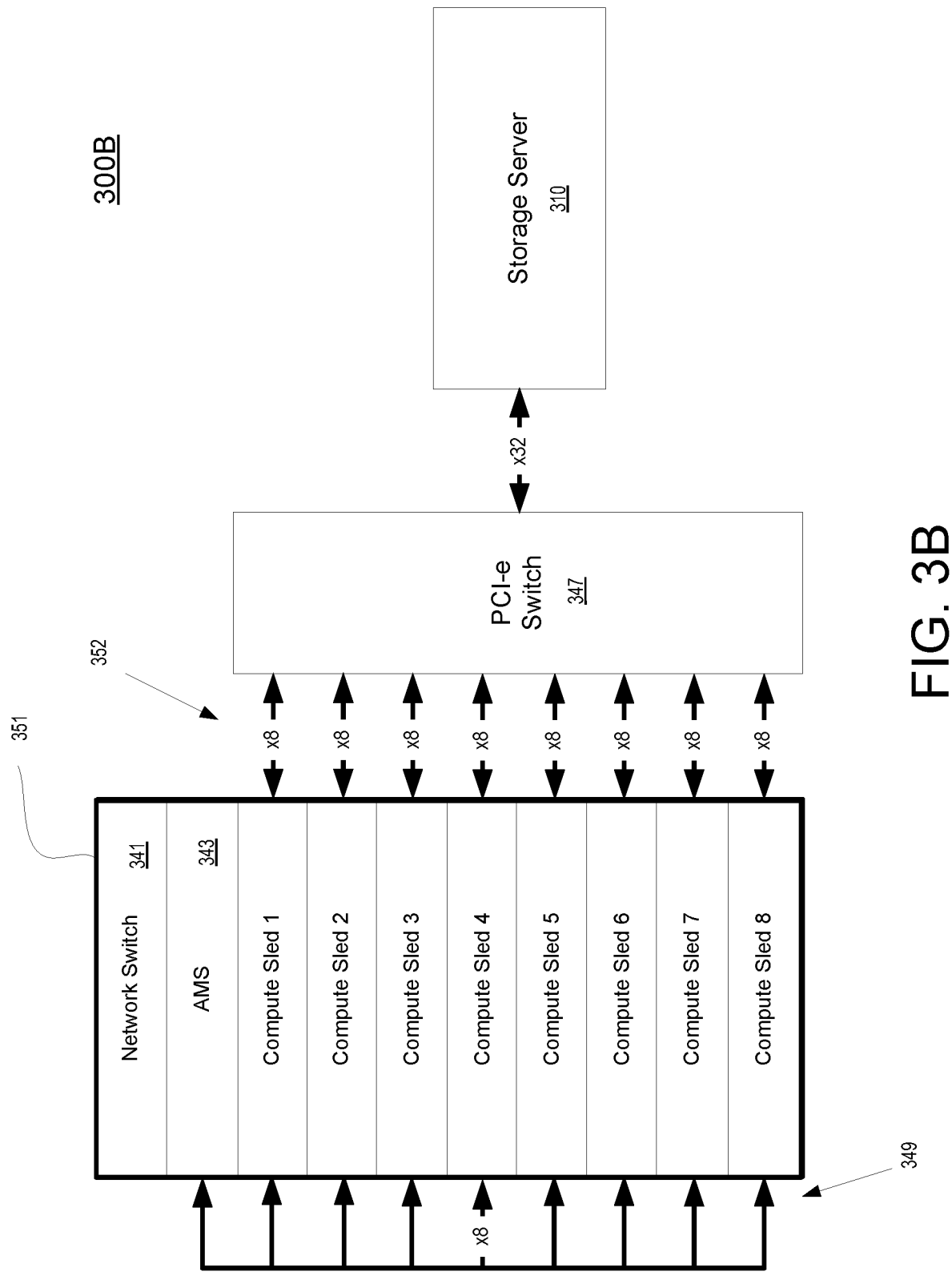
FIG. 3B is a diagram of a streaming array including a plurality of compute nodes located within a rack assembly configured for providing high speed access to network storage to compute nodes using PCIe communications, in accordance with one embodiment of the present disclosure.

FIG. 3B is a diagram of a streaming array 351 including a plurality of compute nodes located within a rack assembly (not shown) configured for providing high speed access to network storage 310 to compute nodes using PCIe communications, in accordance with one embodiment of the present disclosure. A rack assembly configured for streaming content to one or more users is divided in "Streaming Arrays", such as streaming arrays 1-4 of FIG. 3A accessing network storage 310. In particular, streaming arrays are a section of rack assembly (e.g., rack assembly 300A of FIG. 3A) consisting of a network switch, an Array Management Server (AMS) and multiple compute sleds (e.g., one or more compute sleds per array, each compute sled holding one or more compute nodes), as previously described. Multiple streaming arrays 351 are configured within a rack assembly (e.g., rack assembly 300A) to share a network storage 310, but otherwise act independently.

As shown, Array Management Server (AMS) 343 is a server within a corresponding streaming array 351, which is responsible for managing all operations within the streaming array. Roughly it is handling two classes of operations. First, the AMS 343 manages "configuration work", which is about ensuring each compute sled (e.g., sleds 1-8) is in working order. This involves powering sleds, ensuring software is up to date, configuration of networking, configuration of PCIe switch, etc. A second class of operation for the AMS 343 is management of Cloud Gaming sessions. This involves setting up a Cloud Gaming session on a corresponding compute node, providing network/internet access to one or more compute nodes, providing storage access and monitoring of a cloud gaming session.

As such, the AMS 343 is configured to manage compute nodes and compute sleds in the corresponding streaming array 351, wherein each compute sled includes one or more compute nodes. For example, the AMS 343 enables power delivery to compute nodes using general purpose input/output (GPIO) to a power interposer. The AMS 343 is configured to control and monitor compute nodes using universal asynchronous receive transmit (UART) signals delivering serial data (e.g., power on/off, diagnostics, and logging information), in one embodiment. The AMS 343 is configured to perform firmware updates on compute nodes. The AMS 343 is configured to perform configuration of compute sleds and the corresponding PCIe switch 347.

The streaming array 351 is configured to provide storage across PCI Express to compute nodes, as previously described. For example, a PCIe fabric provides data path 352 between compute nodes on compute sleds and the PCIe switch 347). Read-write storage access per compute node is provided at up to 500 megabytes per second (MB/s), in embodiments. In addition, there is 1-2 Gigabytes (GB) per storage per compute node, in one implementation, though other sizes of storage are supported.

As shown in FIG. 3B, the main functionality of the AMS 343 is the PCI Express fabric connection to each of the compute sleds. For example, PCIe fabric 352 is shown providing communication between compute nodes on compute sleds and the AMS 343. In one embodiment, the PCI Express fabric connection is implemented using "passive PCI Express adapters," as each compute sled may be configured with a PCI Express Gen4 switch, and distance between AMS and compute sleds should be short.

In addition, each streaming array 351 provides network/internet access to compute nodes, as previously described. For example, network access (e.g., through network switch 341 and over a path—not shown, such as Ethernet) is provided at 100 megabits per second (mb/s) per compute node.

The AMS 343 may be configured with a central processing unit (CPU) with random access memory (RAM), in one embodiment. There may be an input/output (I/O) for PCIe fabric. There may be a network connection for Ethernet).

The AMS 343 may be configured with storage (e.g., 2×2 terabyte NVMe), in one embodiment. In addition, there may be a PCIe fabric connection to each compute sled, such as using a passive PCIe fabric adapter. Also, there is a bus bar providing power (e.g., 12 volts).

Figure 4A:
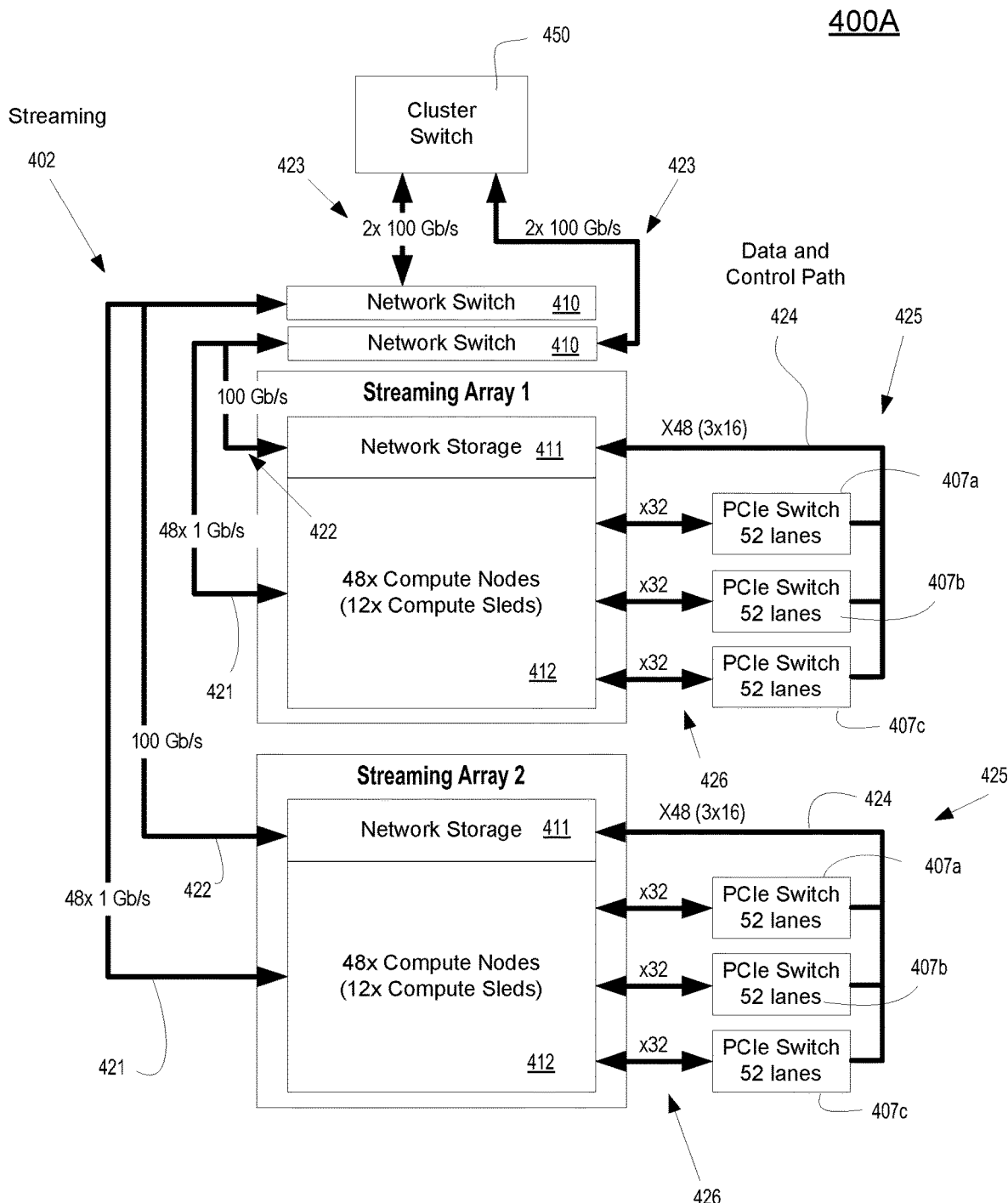
FIG. 4A is a diagram of a rack assembly configured for providing high speed access to network storage to compute nodes using PCIe communications, wherein each network storage is accessible by a corresponding array of compute nodes, in accordance with one embodiment of the present disclosure.

FIG. 4A is a diagram of a rack assembly 400A configured for providing high speed access to network storage to compute nodes using PCIe communications, wherein each network storage is accessible by a corresponding streaming array of compute nodes of a corresponding rack assembly, in accordance with one embodiment of the present disclosure. As shown, the diagram of FIG. 4A shows a high-level rack design for the rack assembly 400A. Rack assembly 400A may be representative of one or more of the plurality of rack assemblies 221 of FIG. 2B. For example, rack assembly 400A may be representative of rack assembly 221N.

As shown in FIG. 4A, rack assembly 400A includes two streaming arrays, streaming array 1 and streaming array 2, though it is understood that rack assembly 400A may include one or more streaming arrays. More particularly, each streaming array includes network storage 411 and a plurality of compute sleds 412. Each streaming array is independently operable and including a corresponding network storage, a corresponding PCIe fabric, a corresponding Ethernet fabric, and corresponding network switch.

The rack assembly 400A is designed around the requirement to provide high-speed storage access (e.g., at up to or greater than 4-5 GB/s) to each compute node. Storage is provided by a network storage 411 of a corresponding streaming array, which stores game content in RAM and on NVMe drives (i.e., not a conventional just a bunch of disks—JBOD—storage server). In one embodiment, the game content is "read-only," and as such can thus be shared among systems within the streaming array. Individual compute nodes access the game content at the network storage 411 through a PCIe fabric (e.g., providing data and control path 401) between each of the streaming arrays and the network storage 411, as will be further described below.

Also, the rack assembly 300A is configured with shared power as managed by a rack management controller (not shown). In addition, the rack assembly may be configured with shared cooling (not shown).

For example, each of the streaming arrays 1 and 2 includes a plurality of compute nodes 412 arranged in plurality of compute sleds, wherein each compute sled includes one or more compute nodes. Further, each compute node is configured for executing one or more instances of a plurality of gaming applications. For purposes of illustration each streaming array may be configured with 12 compute sleds (i.e., configurable to include a selectable number of sleds), wherein each compute sled includes one or more compute nodes. In one implementation, each compute sled includes four compute nodes, such that each streaming array includes 48 compute nodes (i.e., 12 compute sleds at four compute nodes per compute sled).

Each streaming array #1 and 2 includes network storage 411, or a storage server. For example, user data and game data and game packages may be stored on network storage 411, and accessed through high speed networking by the compute nodes (e.g., through NFS based network storage). Each network storage 411 of a corresponding streaming array is shared by the compute nodes of that streaming array. In particular, each individual network storage 411 may include non-volatile memory, wherein one or more non-volatile memory is configured as a non-volatile memory Express (NVMe) drive. NVMe drives provide access to memory using the PCI Express (PCIe) interface (i.e., instead of a serial advance technology attachment—SATA—controller) For example, each network storage includes 27 terabytes (TB) of NVMe storage. NVMe drives provide for game package storage (e.g., cache storage at the streaming array) that is more economical over storage implementing double data rate 4 (DDR4) synchronous dynamic random access memory (SDRAM) technology.

Embodiment of the present disclosure provides for high speed access to network storage at greater than approximately 4 gigabytes per second (GB/s) bandwidth per compute node at NVMe level latencies. This is achieved through PCI Express switching technology and a rack-wide PCI Express fabric, such as PCI Express Gen4 (4th generation), in one embodiment.

In particular, each streaming array may include a corresponding PCIe fabric 425 (e.g., Gen4) that is configured to provide direct access to the corresponding network storage 411 from a plurality of compute nodes 412. The PCIe fabric 425 includes one or more array-level PCIe switches 407, wherein each array-level PCIe switch is communicatively coupled to corresponding compute nodes of corresponding compute sleds and is communicatively coupled to the network storage 411. As shown in FIG. 4A, there are three array-level PCIe switches (407a, 407b, and 407c) servicing 48 compute nodes, wherein each of the one or more array-level PCIe switches provides communications from corresponding compute nodes of corresponding compute sleds for purposes of streaming data and management information for the plurality of compute sleds and corresponding compute nodes.

For purposes of illustration, each array-level PCIe switch may support 52 lanes, and each array-level PCIe switch is shared between 4 compute sleds. When each compute sled is configured with four compute nodes, each group of 4 compute sleds may access a corresponding array-level PCIe switch over 32 lanes as shown by data path 426 (including 3×32 lanes). That is, each sled has multiple lanes (e.g., 8) lanes of PCIe (e.g., up to 16 gigabytes per second). For example, a total of 3×32 lanes per streaming array is provided to the corresponding PCIe switch 407, which may be configured as having a multi-lane (e.g., 52 lane) PCIe switch. However, each PCIe switch may only provide 16 lanes to the network storage 411, depending on the design. In particular, the three array-level PCIe switches (407a, 407b, and 407c) access the network storage 411 over data and control path 424 including 48 lanes (e.g., 3×16), wherein there is approximately one lane to access network storage 411 per compute node (e.g., 48 lanes for 48 compute nodes). The data and control path 424 allows high speed access to game data stored in network storage 411, as previously described.

In one embodiment, the network storage 411 includes array-level and sled-level management functionality (i.e., merging AMS functionality of FIG. 3A), such as for communicating control and/or management information to the streaming arrays.

In addition, the rack assembly 400A is configured with an Ethernet fabric 402 that provides communications (e.g., control and data transfer) between compute sleds, network storage, and a network switch. For example, Ethernet fabric 402 supports communications between streaming array 1 and a corresponding network switch 410. In particular, Ethernet fabric 402 communicatively couples network switch 410 to network storage 411 of a corresponding streaming array over path 422 (e.g., 100 gigabits per second). In addition, Ethernet fabric 402 communicatively couples network switch 410 to the plurality of compute nodes 412 of a corresponding streaming array over fabric 421. For example, each compute node has 1×1 Gbps Ethernet (e.g., 48×1 Gbps in an Ethernet fabric 421 for 48 compute nodes between the compute nodes and a corresponding network switch 410), which is used for "streaming audio/video" (e.g., broadcasting and/or streaming to a video streaming service).

In addition, each of the network switches 410 is communicatively coupled to a cluster switch 450 providing access to a cluster fabric over path 423 (e.g., redundant 2×100 gigabits per second upstream). In one embodiment, the cluster switch 450 is communicatively coupled to another network switch of another streaming array to provide communications between streaming arrays of the same rack assembly or between different rack assemblies. In another embodiment, the cluster switch 450 is communicatively coupled to a communications network (e.g., internet) to provide network communications that are external to the network architecture (e.g., streaming array, rack assembly, and network storage). In still another embodiment, the cluster switch 450 is communicatively coupled to a distributed storage (e.g., storage 250 of FIG. 2C) that tis configured for storing a plurality of gaming applications (e.g., a full complement of game title packages for a game cloud system).

Each compute node may use a "command buffer" based protocol to request data from a location, in one embodiment. The network storage 411 of a corresponding streaming array is expected to locate the data. In particular, the compute node will use a direct memory access (DMA) engine to move into its own memory during a "read operation". Data stored on the network storage 411 may be stored in RAM and NVMe. Software on the network storage 411 will ensure data is cached in RAM where possible to avoid having to retrieve data from NVMe. Many compute nodes are expected to access the same content, so caching is feasible. A more detailed discussion of configurations of network storage using a DMA engine is provided in FIGS. 7A-7B.

Figure 4B:
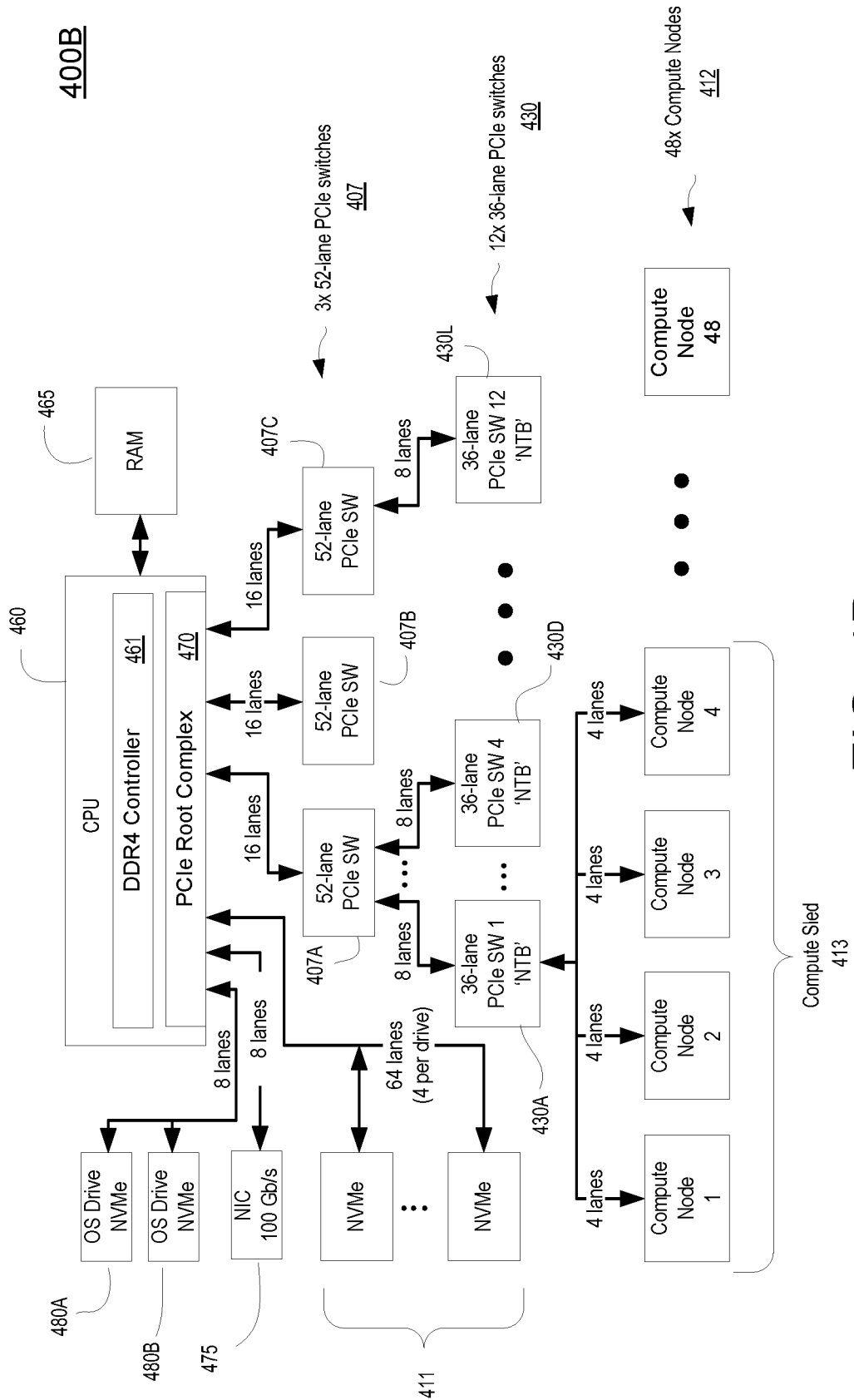
FIG. 4B illustrates a PCIe network within a rack assembly configured for providing high speed access to network storage to compute nodes using PCIe communications, wherein each network storage is accessible by a corresponding array of compute nodes, in accordance with one embodiment of the present disclosure.

FIG. 4B illustrates a storage server configuration 400B for network storage including a PCIe fabric and/or network used within a streaming array of a corresponding rack assembly that is configured for providing high speed access to network storage to compute nodes using PCIe communications, wherein each network storage is accessible by a corresponding array of compute nodes, in accordance with one embodiment of the present disclosure. In particular, FIG. 4B provides a high-level design of the PCIe fabric (e.g., fabric 425, 426, etc.) introduced in FIG. 4A. For example, a dual level switching fabric is used between compute nodes and the network storage 411.

The network storage or storage server configuration 400B includes CPU 460 (e.g., 1×16 core CPU), and 8 channels of DDR4 for RAM 465 (e.g., as controlled by the DDR4 controller 461), and the PCIe interface 470 or root complex.

From the PCIe interface 470, there are 128 lanes of PCIe to various components, including 48 lanes to a PCIe switching fabric, 64 lanes to the network storage 411, 8 lanes to a network interface card (NIC) 475 (e.g., 100 gigabits per second) providing network/internet access to compute nodes (e.g., 100 gigabits per second), and 8 lanes to operating system (OS) NVMe drives 480A and 480B for memory needed to run the operating system (OS).

In particular, there are 64 lanes for accessing 16 NVMe drives (e.g., 4 lanes per drive) in network storage 411. In one implementation, the architecture for the network storage 411 includes 14 active NVMe drives, and 2 optional drives for redundancy (e.g., swapping out an NVMe drive in case of failure). Other embodiments support more than 14 NVMe drives or less than 14 NVMe drives, depending on the design and technology.

As shown, a streaming array includes a plurality of compute nodes 412. A compute sled 413 may include four compute nodes, and a group of four compute sleds (each compute sled using 4 lanes) may access over 16 lanes a corresponding sub-array-level PCIe switch that is configured with 36 lanes. For example, compute sled 413 accesses sub-array-level PCIe switch 430A over 16 lanes. As such, there are 12 sub-array-level PCIe switches 430A, 430B, 430C, 430D, . . . , and 430L (each configured with 36 lanes) supporting the 12 compute sleds including the 48 compute nodes of a streaming array. Further, the sub-array-level PCIe switches 430A-430N is communicatively coupled to the three array-level PCIe switches 407a, 407b, and 407c. In particular, a group of 4 sub-array-level PCIe switches (each configured as 36 lanes) is communicatively coupled to and/or share a corresponding array-level PCIe switch (e.g., 52 lanes), wherein each sub-array level PCIe switch communicates over 8 lanes to the array-level PCIe switch. For example, a group including sub-array-level PCIe switches 430A, 430B, 430C, and 43D accesses array-level PCIe switch 407a. Each of the array-level PCIe switches 407a, 407b, and 407c is communicatively coupled over 16 lanes to the PCIe interface 470 or root complex, such that the three array level PCIe switches 407a, 407b, and 407c is communicatively coupled to the PCIe interface 470 over 48 lanes, wherein there is approximately one lane to access network storage 411 per compute node (e.g., 48 lanes for 48 compute nodes.

Figure 4C:
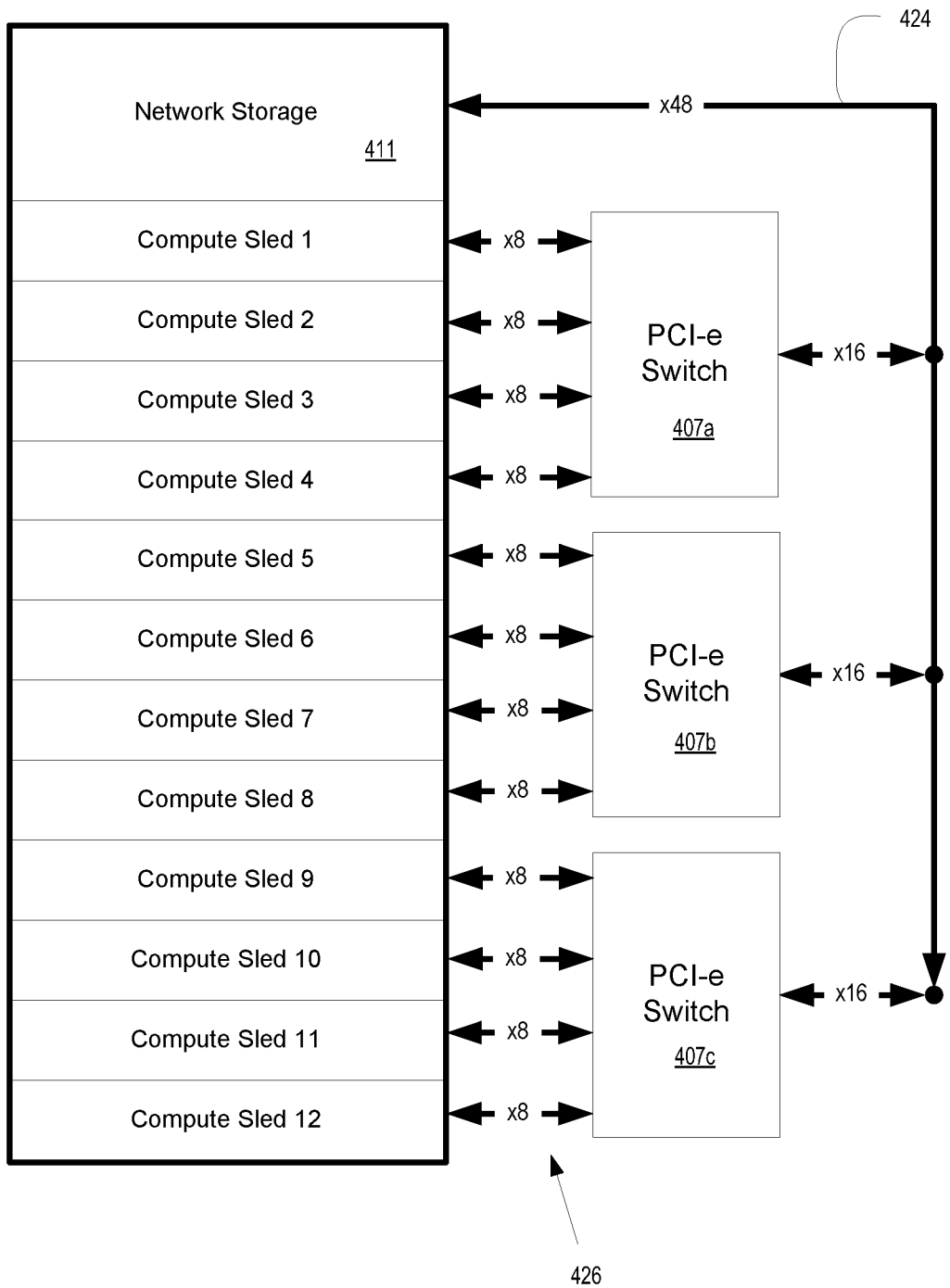
FIG. 4C is a diagram of a streaming array including a plurality of compute nodes located within a rack assembly configured for providing high speed access to network storage to compute nodes using PCIe communications, wherein each network storage is accessible by a corresponding array of compute nodes, in accordance with one embodiment of the present disclosure.

FIG. 4C is a diagram of a streaming array 400C including a plurality of compute nodes located within a rack assembly configured for providing high speed access to network storage to compute nodes using PCIe communications, wherein each network storage is accessible by a corresponding array of compute nodes, in accordance with one embodiment of the present disclosure. For example, streaming array 400C may be streaming array 1 or streaming array 2 of rack assembly 400A. In particular, streaming array 400C includes multiple compute sleds (e.g., one or more compute sleds per array, each compute sled holding one or more compute nodes), network storage 411 and a PCIe fabric as previously described. A rack assembly (e.g., rack assembly 400A) may include one or more streaming arrays, but network storage is used by compute nodes of a corresponding streaming array in a one-to-one relationship.

In one embodiment, network storage 411 is responsible for managing all operations within the streaming array 400C. That is, the network storage 411 has incorporated the functionality of the AMS of the rack assembly of FIG. 3A. Roughly it is handling two classes of operations. The first class of operations includes "configuration work", which is about ensuring each compute sled (e.g., sleds 1-12) is in working order. This involves powering sleds, ensuring software is up to date, configuration of networking, configuration of PCIe switch, etc. A second class of operations is management of Cloud Gaming sessions. This involves setting up a Cloud Gaming session on a corresponding compute node, providing network/internet access to one or more compute nodes, providing storage access and monitoring of a cloud gaming session. As such, the network storage 411 is configured to manage compute nodes and compute sleds in the corresponding streaming array 411, wherein each compute sled includes one or more compute nodes. For example, management includes enabling power delivery to compute nodes using general purpose input/output (GPIO) to a power interposer. Control and monitoring of compute nodes may be performed using universal asynchronous receive transmit (UART) signals delivering serial data (e.g., power on/off, diagnostics, and logging information), in one embodiment. Also, network storage 411 is configured to perform firmware updates on compute nodes, and perform configuration of compute sleds and the corresponding PCIe switch 347.

The streaming array 400C is configured to provide storage across PCI Express to compute nodes, as previously described. For example, a PCIe fabric 423 provides data paths between compute nodes on compute sleds and the array-level PCIe switches 407a, 407b, and 407c. In one embodiment, a PCI Express fabric connection is implemented using "passive PCI Express adapters," as each compute sled may be configured with a PCI Express Gen4 switch, and distance between sub-array level and array-level PCIe switches and compute sleds should be short. In addition, each array-level PCIe switch provides 16 lanes that combined form data and control path 424. Read-write storage access per compute node is provided at up to 500 megabytes per second (MB/s), in embodiments. In addition, there are 1-2 Gigabytes (GB) per storage per compute node, in one implementation, though other sizes of storage are supported.

Figure 5A:
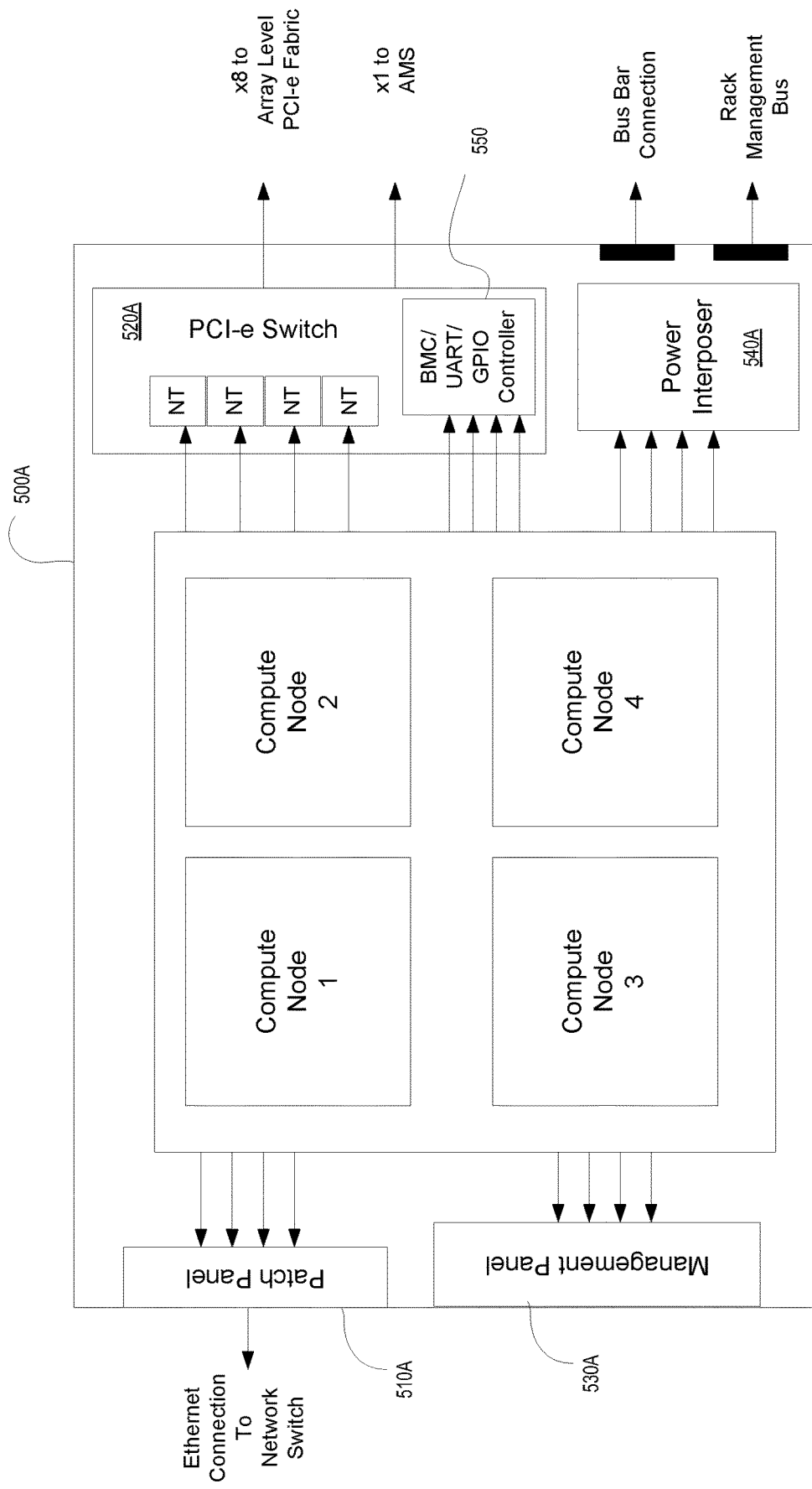
FIG. 5A is a diagram of a compute sled including a plurality of compute nodes located within a rack assembly configured for providing high speed access to network storage to compute nodes using PCIe communications, wherein the network storage is accessible by one or more arrays of compute nodes, in accordance with one embodiment of the present disclosure.

FIG. 5A is a diagram of a compute sled 500A including a plurality of compute nodes (e.g., nodes 1-4) located within a rack assembly configured for providing high speed access to network storage to compute nodes using PCIe (e.g., Gen 4-4$^{th}$ generation) communications, in accordance with one embodiment of the present disclosure. FIG. 5A shows a plurality of compute nodes (e.g., nodes 1-4) and auxiliary hardware to support operation of the compute nodes. The compute sled may be implemented within any of the streaming arrays and/or rack assemblies previously introduced in FIGS. 2A-2C, 3A, and 4A-4B.

Each compute sled 500A includes one or more compute nodes. Although FIG. 5A shows a compute sled including four compute nodes (e.g., nodes 1-4), it is understood that any number of compute nodes may be provided in a compute sled, including one or more compute nodes. The compute sled 500A may provide a hardware platform (e.g., circuit board) providing compute resources (e.g., through compute nodes). Each compute sled includes one or more compute nodes (e.g., nodes 1-4). Each compute node located within a rack assembly is configured for providing high speed access to network storage (not shown) to compute nodes using PCIe communications (e.g., Gen 4), in accordance with one embodiment of the present disclosure. A compute node includes several I/O interfaces. For example, the compute node may include an M.2 port, and multiple lanes for PCIe Gen4 (bi-directional).

The PCIe (e.g., Gen4) interface (e.g., 4 lanes) can be used to expand the system with additional devices. In particular, the PCIe interface is used to connect to a PCIe fabric including a PCI Express switch 520A for high-speed storage. In addition, the compute node includes Ethernet connections (e.g., gigabit Ethernet) via patch panel 510A. Also, the compute node includes one or more universal asynchronous receiver transmitter (UART) connections that are configured for transmitting and/or receiving serial data. For example, there may be one or more UART ports, which are meant for management purposes (e.g., connecting compute nodes with the board management controller (BMC)/UART/GPIO controller 550). A port may be used for remote control operations such as "power on", "power off" and diagnostics. Another UART port provides serial console capabilities.

As shown, the compute sled 500A includes PCIe switch board 520A providing 8 PCIe lanes to the array-level PCIe fabric. Also, the compute sled 500A includes an Ethernet patch panel 510A, which is configured to connect Ethernet cables between compute nodes (e.g., nodes 1-4) and a rack level network switch (not shown), as previously described. The compute sled 500A includes a management panel 530A. For example, the management panel 530A may give status, such as LEDs and buttons.

The compute sled 500A includes a power interposer board 540A, which is configured to provide power to the compute sled through one or more bus bar connections. A rack management bus may be configured to provide sled management control signals. Each compute node also includes a power input connector (e.g., 12 volts for designed power consumption) connected to power interposer 540A through the bus bar connection.

Figure 5B:
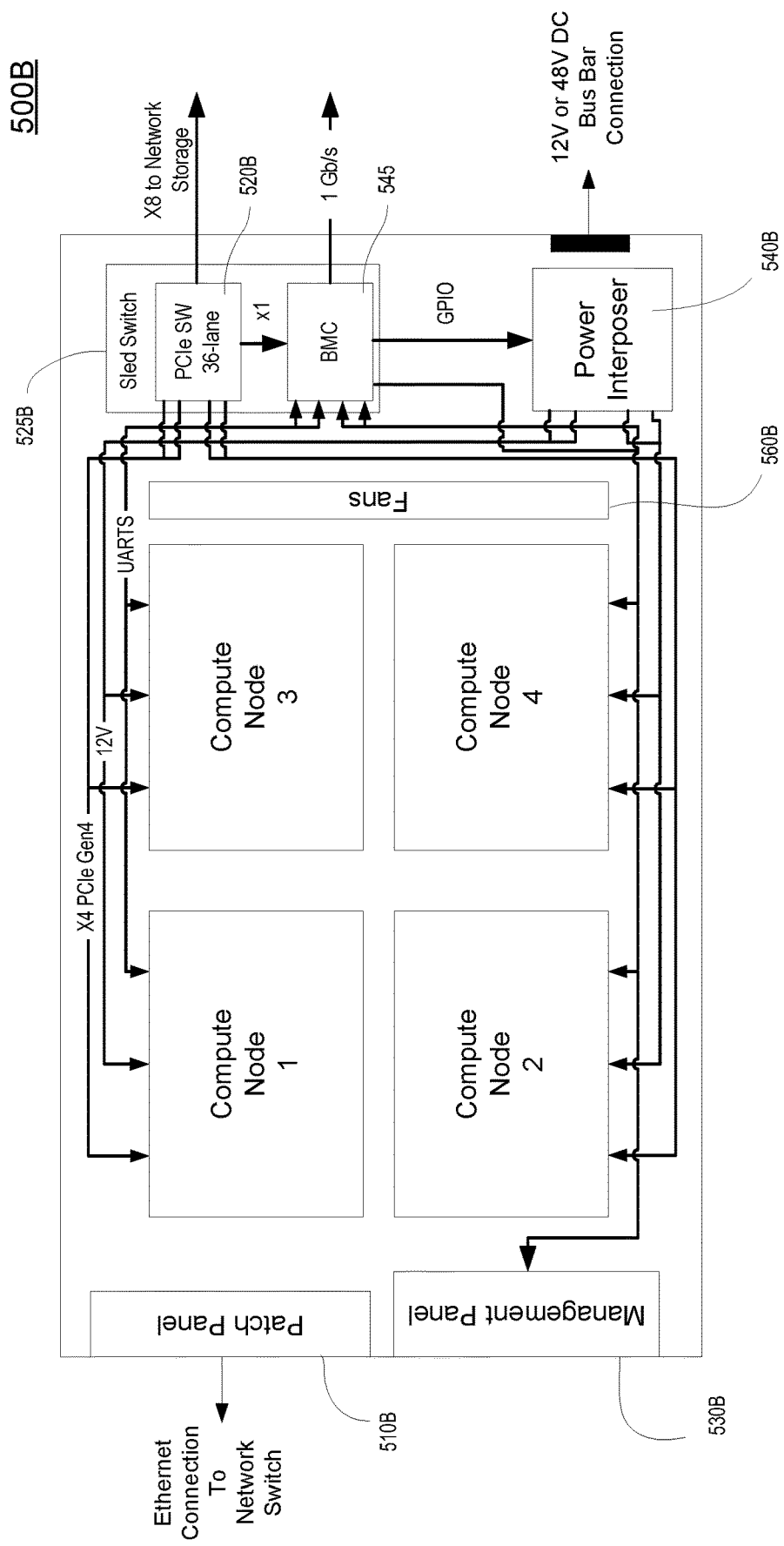
FIG. 5B is a diagram of a compute sled including a plurality of compute nodes located within a rack assembly configured for providing high speed access to network storage to compute nodes using PCIe communications, wherein each compute node includes a network interface card (NIC) configured for accessing a network, in accordance with one embodiment of the present disclosure.

FIG. 5B is a diagram of a compute sled 500B including a plurality of compute nodes located within a rack assembly configured for providing high speed access to network storage to compute nodes using PCIe communications, wherein each compute node includes a network interface card (NIC) configured for accessing a network, in accordance with one embodiment of the present disclosure. The rack assembly is configured for providing high speed access to network storage to compute nodes using PCIe ((e.g., Gen 4-4$^{th}$ generation) communications. The compute sled 500B may be implemented within any of the streaming arrays and/or rack assemblies introduced in FIGS. 2A-2C, 3A, and 4A-4B. Compute sled 500B is similar to compute sled 500A, with modifications.

Each compute sled includes one or more compute nodes, such as four compute nodes (e.g., nodes 104. The compute sled 500B provides a hardware platform (e.g., circuit board providing compute resources (e.g., through the compute nodes). Each compute node located within a rack assembly is configured for providing high speed access to network storage (not shown) to compute nodes using PCIe communications (e.g., Gen 4), in accordance with one embodiment of the present disclosure. A compute node includes several I/O interfaces. For example, the compute node may include an M.2 port, and multiple lanes for PCIe Gen4 (bi-directional). The compute node may include one or more UART connections configured for transmitting and receiving serial data, such as one or more UART ports configured for management purposes (e.g., connecting compute nodes with the BMC 545). A port may be used for remote control operations such as "power on", "power off" and diagnostics. Another UART port provides serial console capabilities.

In particular, the compute sled 500B includes an Ethernet patch panel 510B, which is configured to provide Ethernet communications (e.g., gigabit Ethernet) to compute nodes, such as by connecting Ethernet cables between compute nodes (e.g., NICs located on each of the nodes 1-4, though not shown) and a rack level network switch (not shown), as previously described.

The compute sled 500B includes a sled switch 525B including a PCIe switch 520B providing 8 PCIe lanes to the array-level PCIe fabric and network storage (e.g., at least 16 gigabytes per second bidirectional data transfer) for high speed storage. In particular, PCIe switch 520B may be configured with 36 lanes, of which 33 are used (e.g., 4 lanes per compute node). The PCIe (e.g., Gen4) interface (e.g., 4 lanes) to compute nodes can be used to expand the system with additional devices.

In addition, one lane of the PCIe switch 520B is reserved for communications with the board management controller (BMC) 544 for board management control (e.g., 1 gigabit per second to the PCIe fabric). For example, board management provided by BMC 544 includes control, monitoring, and management of compute nodes is performed using universal asynchronous receive transmit (UART) signals delivering serial data (e.g., power on/off, diagnostics, and logging information) for each compute node. In addition, the BMC 544 may be configured to provide electromagnetic compatibility (EMC) control for controlling electromagnetic energy, and debug lagging using UART signals. BMC 544 may be configured to enable power control/delivery to compute nodes using general purpose input/output (GPIO) to a power interposer 540B. BMC 544 may be configured to provide control status light emitting diodes (LEDs) on a management panel 530B, which is further configured to give status using LEDs, and buttons. BMC 544 is configured to provide temperature and voltage monitoring. Also, BMC 544 is configured for managing fans 560B configured for cooling. The BMC 544 is also configured for managing the Ethernet connection for board management.

The power interposer board 540B is configured to provide power (e.g., 12 volts or 48 volts direct current—DC) to the compute sled through one or more bus bar connections. Each compute node also includes a power input connector (e.g., 12 or 48 volts for designed power consumption) connected to power interposer 540B through the bus bar connection.

Figure 5C:
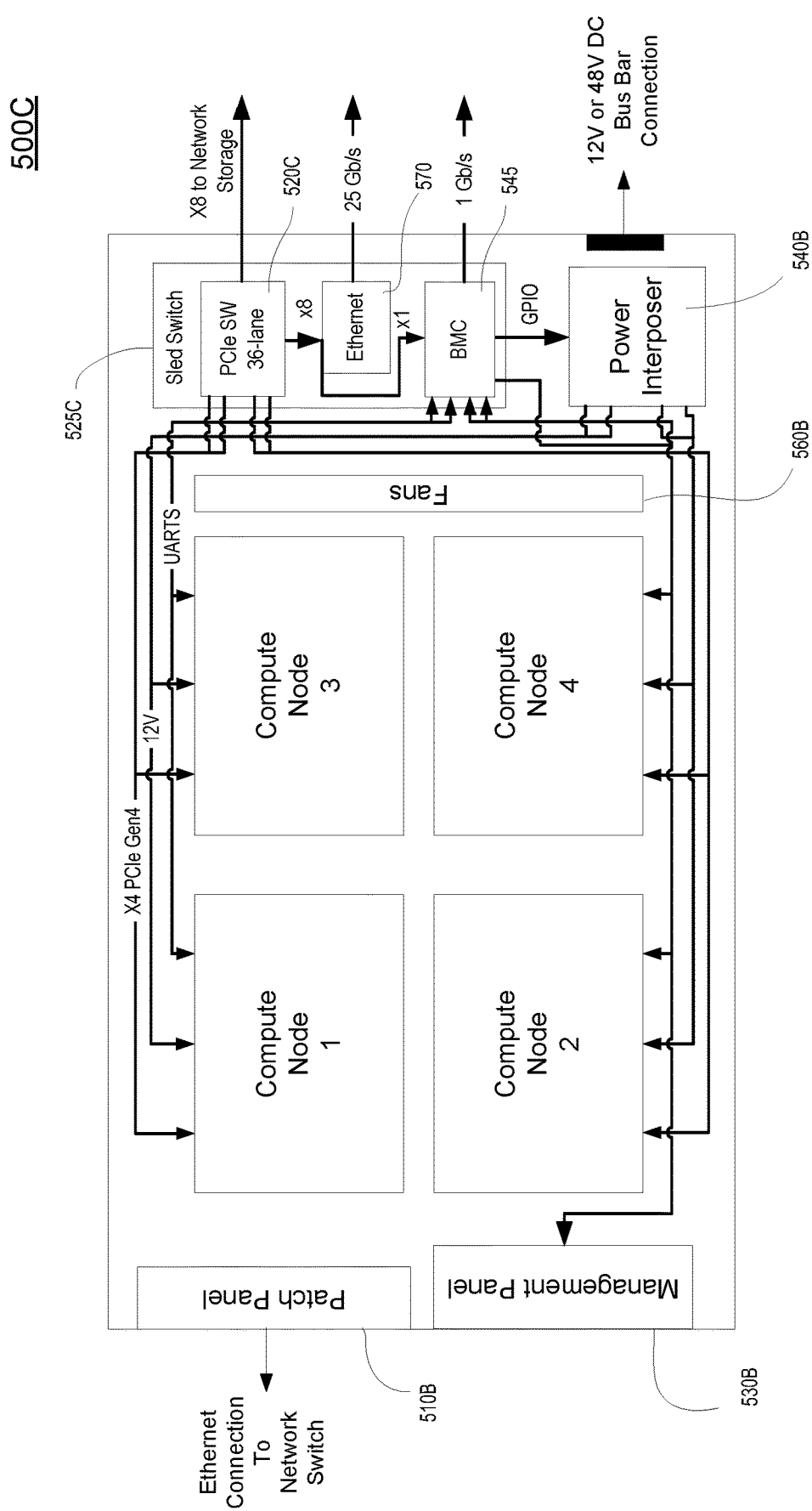
FIG. 5C is a diagram of a compute sled including a plurality of compute nodes located within a rack assembly configured for providing high speed access to network storage to compute nodes using PCIe communications including at least one network interface card (NIC) accessible by one or more compute nodes for accessing a network, wherein each network storage is accessible by a corresponding array of compute nodes, in accordance with one embodiment of the present disclosure.

FIG. 5C is a diagram of a compute sled 500C including a plurality of compute nodes located within a rack assembly configured for providing high speed access to network storage to compute nodes using PCIe communications including at least one network interface card (NIC) accessible by one or more compute nodes for accessing a network, wherein each network storage is accessible by a corresponding array of compute nodes, in accordance with one embodiment of the present disclosure. The rack assembly is configured for providing high speed access to network storage to compute nodes using PCIe ((e.g., Gen 4-4$^{th}$ generation) communications. The compute sled 500B may be implemented within any of the streaming arrays and/or rack assemblies introduced in FIGS. 2A-2C, 3A, and 4A-4B. Compute sled 500B is similar to compute sled 500A, with modifications.

The compute sled 500C is similarly configured as compute sled 500B of FIG. 5B with like numbered components providing similar functionality. However, compute sled 500C also includes at least the addition of an Ethernet NIC 570 that is configured to provide network interfacing over Ethernet to an Ethernet fabric, as previously described (e.g., through a network switch). In particular, the NIC 570 is communicatively coupled to the array-level PCIe switch, which allows each compute node to access the PCI switch. NIC 570 provides an alternate high speed data transfer (e.g., 10 gigabits per second, 25 Gbps, or even 100 Gbps) that may be faster than the NIC connections (e.g., 1 gigabit per second) provided by each of the compute nodes (e.g., 1-4) on the compute sled 500C.

Ethernet NIC 570 may be configured as a single NIC component, or as a multi-host NIC. The multi-host adapter allows for physical sharing between multiple systems (e.g., compute nodes). In another embodiment, there may be 4 individual Ethernet adapters or NICs providing one NIC per compute node.

Figure 6:
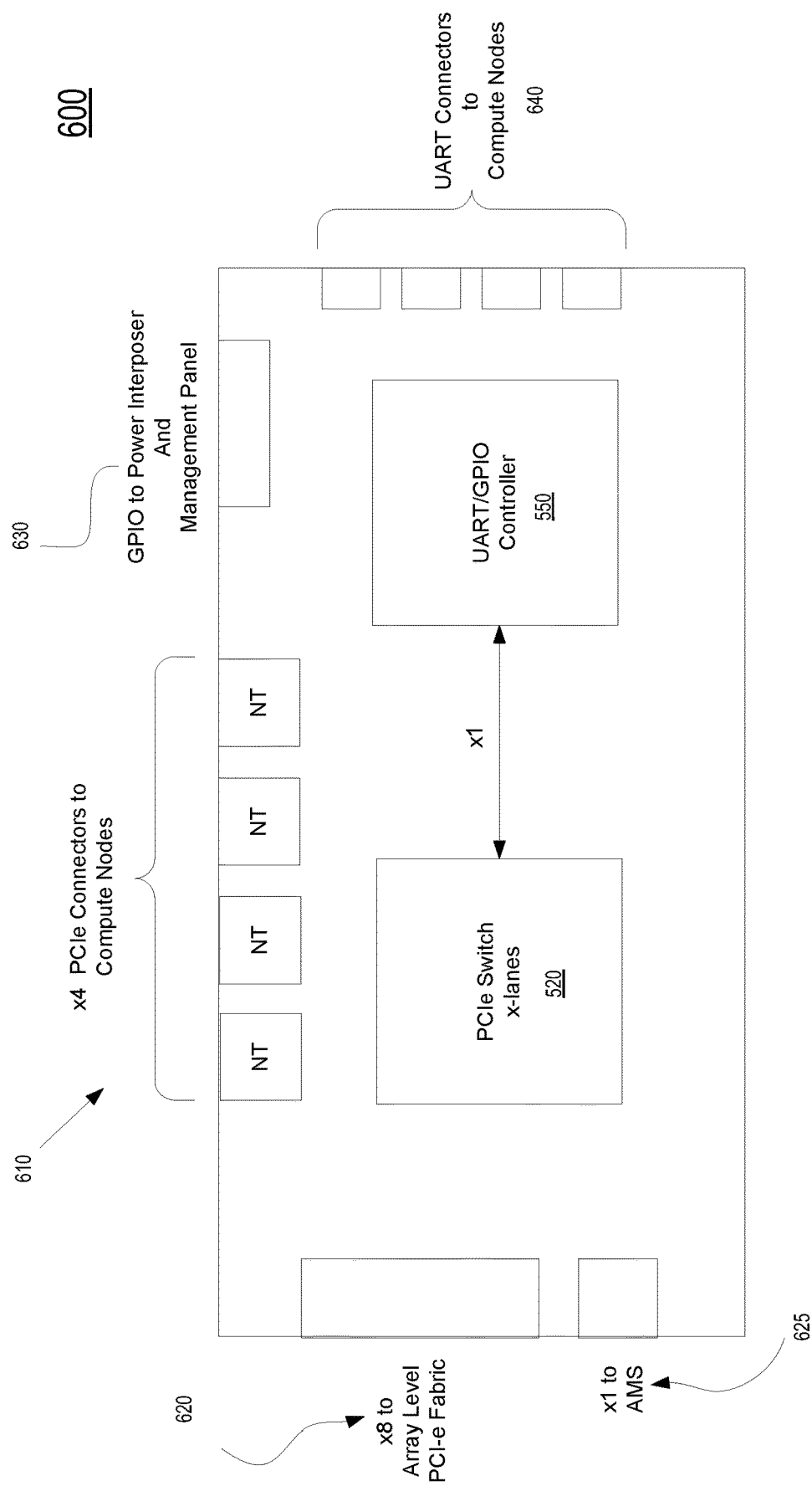
FIG. 6 is a diagram of a sled-level PCIe switch located within a rack assembly configured for providing high speed access to network storage to compute nodes using PCIe communications, in accordance with one embodiment of the present disclosure.

FIG. 6 is a diagram of a sled-level PCIe switch 600 located within a rack assembly configured for providing high speed access to network storage to compute nodes using PCIe communications, in accordance with one embodiment of the present disclosure.

The sled PCIe switch 600 may be configured as a circuit board within a corresponding compute sled, which has two roles. First, the sled-level PCIe switch 600 has a "fabric role" in which it connects individual compute nodes (e.g., 4 compute nodes) to AMS and to a corresponding network storage across a PCIe (e.g., Gen4) bus 620 by means of "non-transparent bridging" (NTB), in one embodiment. Second, the sled-level PCIe switch 600 has a "management role" in which UARTs and GPIO signals are provided for sled management.

In particular, PCIe (e.g., Gen4) connectivity is provided by external cable connectors, internal cable connectors and a PCIe edge connector. For example, an 8-lane PCIe (e.g., Gen4) external cable connection 620 may be used connect the compute sled to the network storage for storage workloads. A second external PCIe (e.g., Gen4) connection 625 to a second PCIe fabric connects to the AMS. For example, the second PCIe connection may include one lane, as it is used primarily for management functions, with auxiliary storage functionality.

In addition, internal PCIe (e.g., Gen4) cable connectors 610 may be used to connect the sled PCIe switch 520 using a cable to each of the compute nodes via their corresponding M.2 interfaces. Other connecting means may be implemented. For example, instead of using M.2 connection interfaces, other connectors and/or connector interfaces may be used, such as OCuLink, Slimline SAS, etc.

The management interface in the form of a UART and GPIO controller 550 is used by the AMS (not shown) to communicate with individual compute nodes as well as to manage power. The AMS uses multiple (e.g., two) UART interfaces per compute node for management purposes (e.g. power on/off, diagnostics, logging, etc.). The GPIO functionality is used to manage power delivery to each of the compute nodes through the power interposer board through connection 630. It also connects to a management panel (e.g., for LEDs and buttons) through connection 630, as previously described.

The sled-level PCIe switch 600 may include a PCIe (e.g., Gen4) switch 520. Also, multiple (e.g., four) Non-transparent (NT) bridging interfaces may be included. Further, multiple (e.g., four) DMA (direct memory access) engines may be included.

In addition, a UART/GPIO controller 550 is configured and includes a PCIe interface to PCIe switch, multiple (e.g., 8×) UART channels 640, and multiple (8×) GPIO connections the power interposer and management panel.

In addition, there are connectors to the PCIe fabric for network storage access. For example, in one implementation, an 8-lane external PCIe connector 620 to PCIe fabric to network storage is provided.

As previously described, a one lane external PCIe connector 625 to a second PCIe fabric providing access to AMS is also provided within the sled-level PCIe switch board 600. One or more PCIe edge connectors may also be provided.

Further, four multi lane (e.g., 4 lanes) internal PCIe connections 610 to compute nodes may be provided. For example, each compute node has 4 lanes.

There may be included a GPIO connector 630 to the power interposer. For example, 4 signals are required, one per compute node.

There may be four dual/pairs of UART connectors to a management panel. For example, each compute node has 2 UART interfaces, in one implementation. In other implementations, each compute node may have less than 2 UART interfaces, or more than 2 UART interfaces.

A power interposer providing power to a sled through connection 630 may be included. The compute sled may include a plurality of compute nodes located within a rack assembly configured for providing high speed access to network storage to compute nodes using PCIe communications, in accordance with one embodiment of the present disclosure. The power interposer delivers power from the rack's 12V bus bar to the compute sled, in one embodiment. In other embodiments, some other voltage is used for powering rack components, such as 48 volts, etc. For example, higher voltages (e.g., 48 volts) may be used for power efficiency purposes. For components that require a specific voltage (e.g., 12 volts), a power interposer may be used to convert power. For example, the power interposer may contain conversion logic (e.g., DC to DC converters) to convert 48 volts (or some other voltage) down to 12 volts. This is used to power the compute nodes as well as any auxiliary hardware. Power delivery to the compute nodes is controllable by GPIO by the sled PCIe switch. For each compute node there may be a dedicated signal to enable/disable power.

Also, a Rack Management Control interface is provided to the Rack Management Controller (RMC) to monitor the Power Interposer board. This provides diagnostic information such as voltages, currents and temperature. Rack management control interface may include voltage and/or current information, and temperature.

Power status information is delivered using GPIO signals to the Management Panel. This includes power status of each compute node as well as 12V status of the power interposer. In addition, a bus (e.g., 12 volt) bar interface is provided.

There may be hot-plug support, for example to add and/or remove compute sleds when power bus is powered on. For example, power may be delivered at 12 volts, or at other levels. Voltage to auxiliary components may be lower (e.g., below 6 volts), which can be generated out of the 12 volts on power bus.

The Management Panel may include a board/panel located in the front of a compute sled and shows sled status through LEDs. For each compute node there may be two LEDs providing control status information. The first is powered by the sled PCIe Switch using a software controllable GPIO signal. The second LED is from the power interposer board and shows power status (e.g., voltage level). A global power status from the Power Interposer board shows the overall power status of the sled.

Figure 7A:
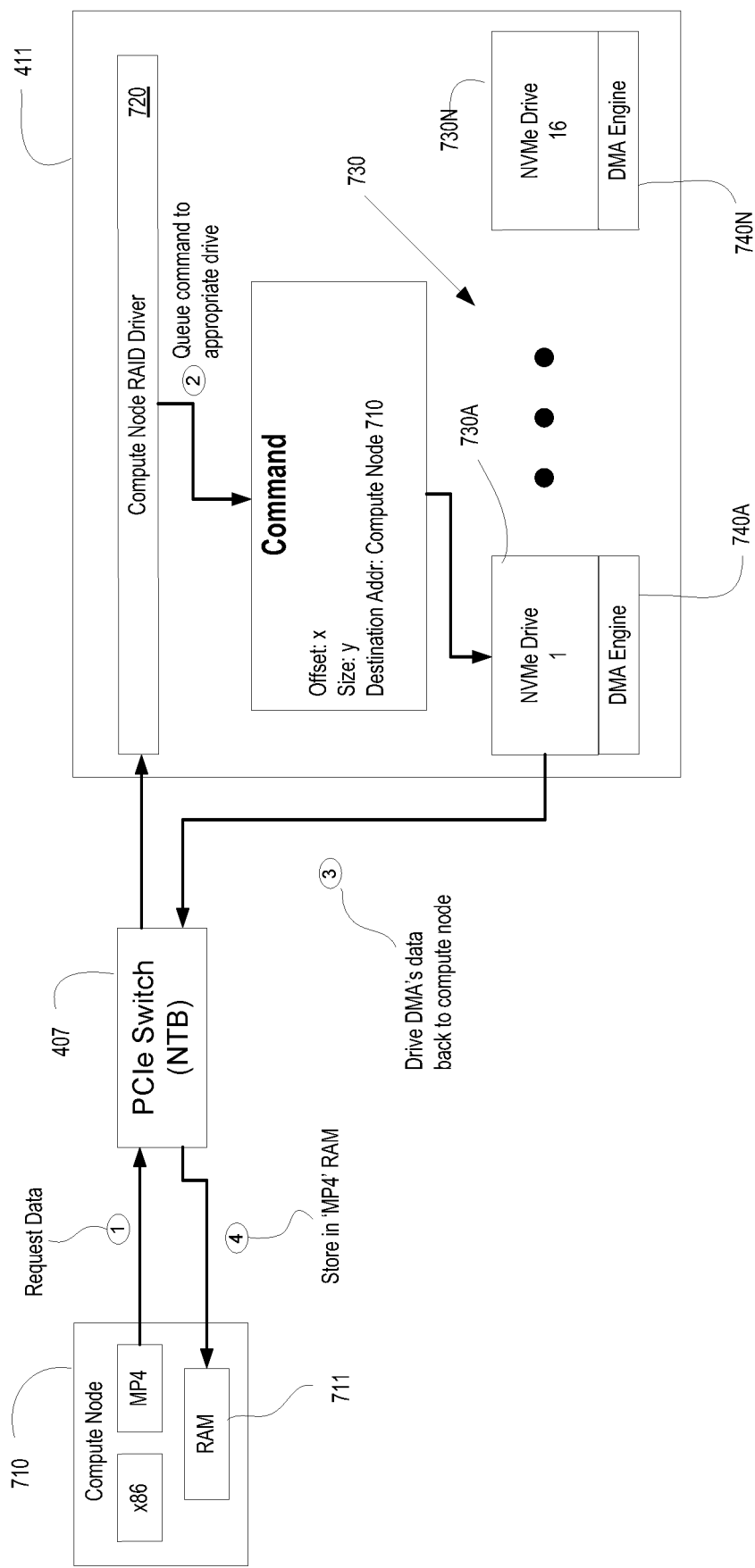
FIG. 7A is a diagram of a data flow between a plurality of compute nodes and network storage in an array, wherein memory access is driven by direct memory access (DMA) engines in the storage drives in the network storage, in accordance with one embodiment of the present disclosure.

FIG. 7A is a diagram of a data flow between a compute node 710 and network storage 411 in a streaming array, wherein memory access is driven by direct memory access (DMA) engines in the storage drives in the network storage, in accordance with one embodiment of the present disclosure. In particular, the data flow (e.g., game data flow) shown in FIG. 7A illustrates how the DMA engine located in each NVMe drive transfers data to compute nodes. For example, the data flow of FIG. 7A may be representative of data flow in streaming arrays introduced previously in FIGS. 2A-2B, 3A-3B, and 4A-4C. Each streaming array and/or network storage per streaming array caches game packages that users are playing within a rack assembly. For example, popular titles will be available on all racks. If a user requests a game title that is not (e.g., "cache miss") on the corresponding rack assembly, the rack assembly will call for the game title to be transferred from distributed storage (or data center storage) to the rack assembly during a session.

The game packages are striped across multiple NVMe drives at the network storage 411 for load balancing and prevention of hot spots (i.e., too much usage on a drive), as previously described. In particular, management of network storage 411 may implement different data storage methods (e.g., RAID striping) across all the NVMe drives. For example, successively stored game titles may begin on different NVMe drives for load balancing, as previously described. Machine learning may be implemented to determine which game titles should be kept, and which are removed at particular periods of time based on current and predicted demand of game titles. In addition, software on the network storage 411 will ensure data is cached in RAM where possible to avoid having to retrieve data from NVMe. Many compute nodes are expected to access the same content, so caching is feasible.

In particular, at step 1, compute node 710 requests data from network storage 411 through PCIe switch 407. The network storage 411 is configured to handle data retrieval from the NVMe drives (e.g., drives 740A-740N). In particular, at step 2, the storage driver 720 (e.g., RAID driver) in network storage 411 receives the request and processes the data request from the compute node 710 to locate the NVMe drive or drives on which data is stored. For purposes of illustration, the data may be located on NVMe drive 740A for the data request, though data may be striped across multiple drives (e.g., for a game package of a gaming application). NVMe drives are not sharable (except SR-IOV) so network storage 411 is configured to manage submission/completion queues for each job or request. As shown, storage driver 720 queues the command for data retrieval for the appropriate NVMe drive(s), with corresponding offset and size and destination address. The destination address can be any address within the network storage's memory map, including NTB (Non-Transparent Bridging) mapped RAM on the compute node. For example, the request for data may be queued for NVMe drive 730A.

After the corresponding NVMe drive(s) access the data, that drive or drives will write back to a completion queue indicating that the request has been handled (e.g., system receives an interrupt giving an update indicating that the READ or WRITE operation has been completed in the corresponding NVMe drive(s)). In that manner, the requesting compute node 710 may be notified of the retrieval of the data. At step 3, the DMA engine 740A in the corresponding NVMe drive(s) (e.g., NVMe drive 730A) transfers the data directly back to the memory of compute node 710 via the PCIe switch 407. As shown, each of the NVMe drives has a corresponding DMA engine (e.g., NVMe drive 730N has DMA engine 740N). For example, the requested data may be stored in RAM 711 (e.g., MP4 RAM) of the compute node 710. For example, the compute node uses the DMA engine on the NVMe drives to the data into memory on the compute node, such as during a READ operation. In that manner, data is transferred directly from NVMe drives to each compute node.

Figure 7B:
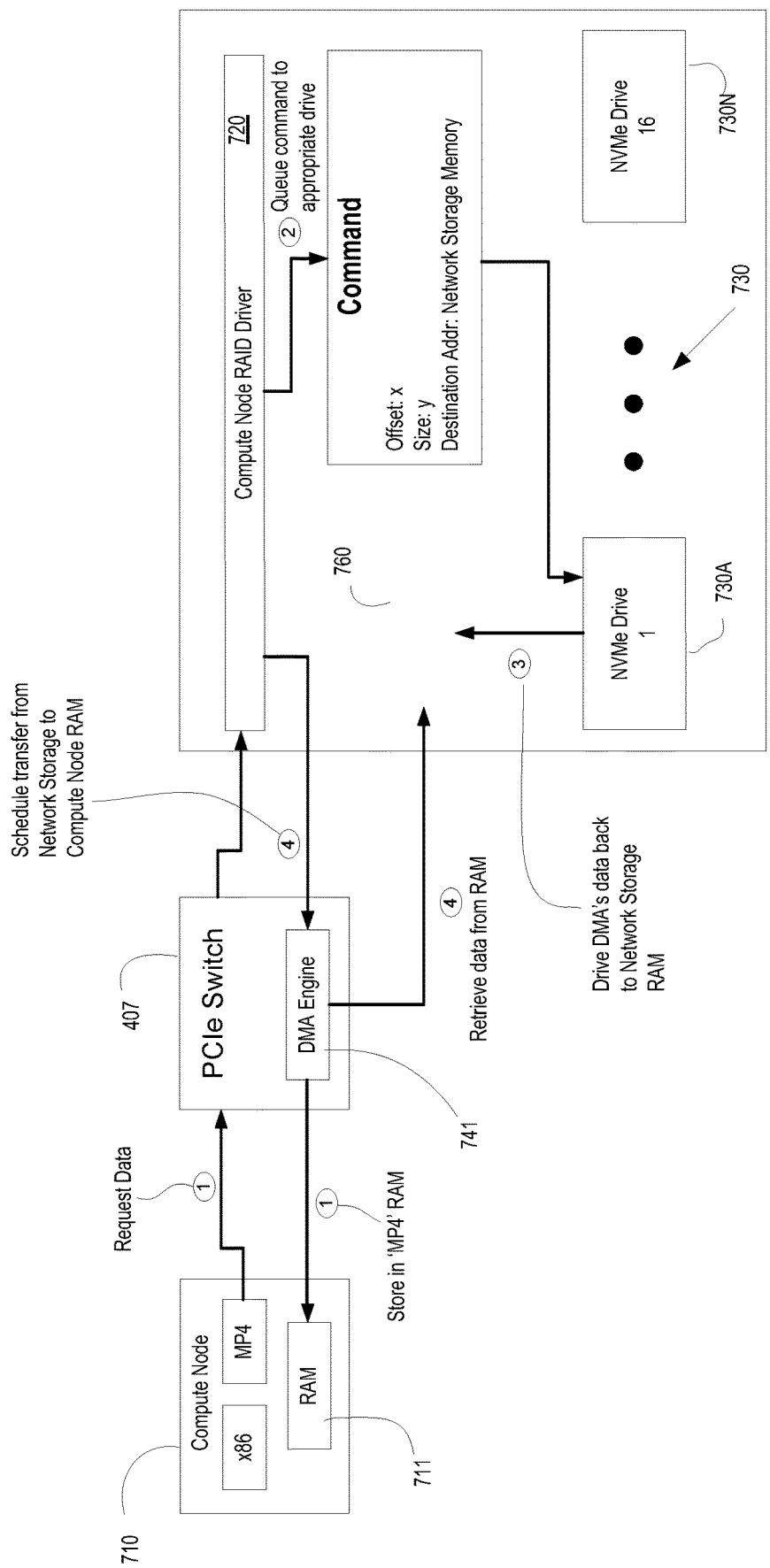
FIG. 7B is a diagram of a data flow between a plurality of compute nodes and network storage in an array, wherein memory access is driven by a DMA engine that is separate from the storage drives in the network storage, in accordance with one embodiment of the present disclosure.

FIG. 7B is a diagram of a data flow between a plurality of compute nodes and network storage in an array, wherein memory access is driven by a DMA engine that is separate from the storage drives in the network storage, in accordance with one embodiment of the present disclosure. In particular, the data flow (e.g., game data flow) shown in FIG. 7B illustrates how the DMA engine 741 located in the PCIe switch 407 transfers data from the network storage 411 to compute nodes in a corresponding streaming array. For example, the data flow of FIG. 7B may be representative of data flow in streaming arrays introduced previously in FIGS. 2A-2B, 3A-3B, and 4A-4C. Each streaming array and/or network storage per streaming array caches game packages that users are playing within a rack assembly. For example, popular titles will be available on all racks. If a user requests a game title that is not (e.g., "cache miss") on the corresponding rack assembly, the rack assembly will call for the game title to be transferred from distributed storage (or data center storage) to the rack assembly during a session.

As previously described, the game packages may be striped across multiple NVMe drives at the network storage 411 for load balancing and prevention of hot spots (i.e., too much usage on a drive), as previously described. In particular, management of network storage 411 may implement different data storage methods (e.g., RAID striping) across all the NVMe drives.

As shown in FIG. 7B, the DMA engine 741 is located at the PCIe switch 407 including NTB, wherein the corresponding NVMe drive(s) transfers data to RAM 760 in network storage 411, and the network storage 411 then transfers the data from the RAM 760 to the compute nodes. In particular, at step 1, compute node 710 requests data from network storage 411 through PCIe switch 407. The network storage 411 is configured to handle data retrieval from the NVMe drives (e.g., drives 740A-740N). In particular, at step 2, the storage driver 720 (e.g., RAID driver) in network storage 411 receives the request and processes the data request from the compute node 710 to locate the NVMe drive or drives on which data is stored. For purposes of illustration, the data may be located on NVMe drive 740A for the data request, though data may be striped across multiple drives (e.g., for a game package of a gaming application). NVMe drives are not sharable (except SR-IOV) so network storage 411 is configured to manage submission/completion queues for each job or request. As shown, storage driver 720 queues the command for data retrieval for the appropriate NVMe drive(s), with corresponding offset and size and destination address. The destination address can be any address within the network storage's memory map, including NTB (Non-Transparent Bridging) mapped RAM on the compute node. For example, the request for data may be queued for NVMe drive 730A. After the corresponding NVMe drive(s) access the data, that drive or drives will write back to a completion queue indicating that the request has been handled (e.g., system3, receives an interrupt giving an update indicating that the READ or WRITE operation has been completed in the corresponding NVMe drive(s)). In that manner, the requesting compute node 710 may be notified of the retrieval of the data.

At step 3, the NVMe drive 730A uses RAM 760 on network storage 411 as the destination address. Because the data is first stored in RAM 760, this allows for caching data this is in high demand. For example, a game title may be cached is multiple users are requesting to play that game. As an illustration, caching allows for reading at an optimal 128 kibibyte (kiB) request size from an NVMe drive for 64 kiB requests. Upon completion of the transfer of data from the NVMe drive 730A to the RAM 760 on network storage 411, at step 4 the network storage 411 schedules a DMA transfer to the RAM 711 (e.g., MP4) of the compute node 710 requesting the data. At step 5, the DMA engine 741 retrieves the data from RAM 760. At step 6, the DMA engine 741 in the PCIe switch 407 transfers the data back to the memory of the compute node 710 via the PCIe switch 407. For example, the requested data may be stored in RAM 711 (e.g., MP4 RAM) of the compute node 710.

Figure 8:
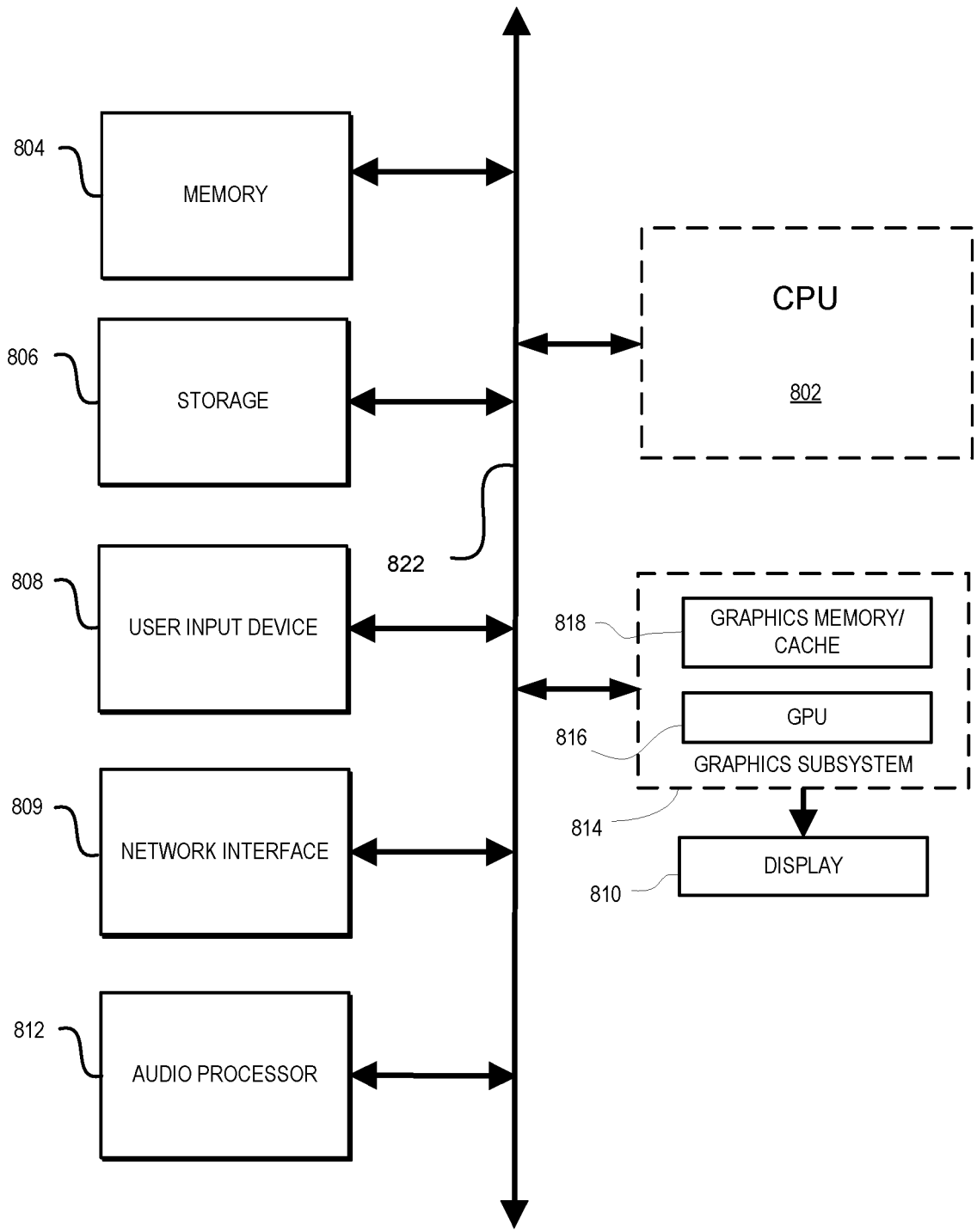
FIG. 8 illustrates components of an example device that can be used to perform aspects of the various embodiments of the present disclosure.

FIG. 8 illustrates components of an example device 800 that can be used to perform aspects of the various embodiments of the present disclosure. For example, FIG. 8 illustrates an exemplary hardware system suitable for providing high speed access to network storage to compute nodes of corresponding compute sleds configured within corresponding streaming arrays, such as within a rack assembly, in accordance with embodiments of the present disclosure. This block diagram illustrates a device 800 that can incorporate or can be a personal computer, a server computer, gaming console, mobile device, or other digital device, each of which is suitable for practicing an embodiment of the invention. Device 800 includes a central processing unit (CPU) 802 for running software applications and optionally an operating system. CPU 802 may be comprised of one or more homogeneous or heterogeneous processing cores.

In accordance with various embodiments, CPU 802 is one or more general-purpose microprocessors having one or more processing cores. Further embodiments can be implemented using one or more CPUs with microprocessor architectures specifically adapted for highly parallel and computationally intensive applications, such as media and interactive entertainment applications, of applications configured for graphics processing during execution of a game.

Memory 804 stores applications and data for use by the CPU 802 and GPU 816. Storage 806 provides non-volatile storage and other computer readable media for applications and data and may include fixed disk drives, removable disk drives, flash memory devices, and CD-ROM, DVD-ROM, Blu-ray, HD-DVD, or other optical storage devices, as well as signal transmission and storage media. User input devices 808 communicate user inputs from one or more users to device 800, examples of which may include keyboards, mice, joysticks, touch pads, touch screens, still or video recorders/cameras, and/or microphones. Network interface 809 allows device 800 to communicate with other computer systems via an electronic communications network, and may include wired or wireless communication over local area networks and wide area networks such as the internet. An audio processor 812 is adapted to generate analog or digital audio output from instructions and/or data provided by the CPU 802, memory 804, and/or storage 806. The components of device 800, including CPU 802, graphics subsystem including GPU 816, memory 804, data storage 806, user input devices 808, network interface 809, and audio processor 812 are connected via one or more data buses 822.

A graphics subsystem 814 is further connected with data bus 822 and the components of the device 800. The graphics subsystem 814 includes at least one graphics processing unit (GPU) 816 and graphics memory 818. Graphics memory 818 includes a display memory (e.g. a frame buffer) used for storing pixel data for each pixel of an output image. Graphics memory 818 can be integrated in the same device as GPU 816, connected as a separate device with GPU 816, and/or implemented within memory 804. Pixel data can be provided to graphics memory 818 directly from the CPU 802. Alternatively, CPU 802 provides the GPU 816 with data and/or instructions defining the desired output images, from which the GPU 816 generates the pixel data of one or more output images. The data and/or instructions defining the desired output images can be stored in memory 804 and/or graphics memory 818. In an embodiment, the GPU 816 includes 3D rendering capabilities for generating pixel data for output images from instructions and data defining the geometry, lighting, shading, texturing, motion, and/or camera parameters for a scene. The GPU 816 can further include one or more programmable execution units capable of executing shader programs.

The graphics subsystem 814 periodically outputs pixel data for an image from graphics memory 818 to be displayed on display device 810, or to be projected by a projection system (not shown). Display device 810 can be any device capable of displaying visual information in response to a signal from the device 800, including CRT, LCD, plasma, and OLED displays. Device 800 can provide the display device 810 with an analog or digital signal, for example.

In other embodiments, the graphics subsystem 814 includes multiple GPU devices, which are combined to perform graphics processing for a single application that is executing on a corresponding CPU. For example, the multiple GPUs can perform multi-GPU rendering of geometry for an application by pretesting the geometry against screen regions, which may be interleaved, before rendering objects for an image frame. In other examples, the multiple GPUs can perform alternate forms of frame rendering, wherein GPU 1 renders a first frame, and GPU 2 renders a second frame, in sequential frame periods, and so on until reaching the last GPU whereupon the initial GPU renders the next video frame (e.g. if there are only two GPUs, then GPU 1 renders the third frame). That is the GPUs rotate when rendering frames. The rendering operations can overlap, wherein GPU 2 may begin rendering the second frame before GPU 1 finishes rendering the first frame. In another implementation, the multiple GPU devices can be assigned different shader operations in the rendering and/or graphics pipeline. A master GPU is performing main rendering and compositing. For example, in a group including three GPUs, master GPU 1 could perform the main rendering (e.g. a first shader operation) and compositing of outputs from slave GPU 2 and slave GPU 3, wherein slave GPU 2 could perform a second shader (e.g. fluid effects, such as a river) operation, the slave GPU 3 could perform a third shader (e.g. particle smoke) operation, wherein master GPU 1 composites the results from each of GPU 1, GPU 2, and GPU 3. In that manner, different GPUs can be assigned to perform different shader operations (e.g. flag waving, wind, smoke generation, fire, etc.) to render a video frame. In still another embodiment, each of the three GPUs could be assigned to different objects and/or parts of a scene corresponding to a video frame. In the above embodiments and implementations, these operations could be performed in the same frame period (simultaneously in parallel), or in different frame periods (sequentially in parallel).

Accordingly, the present disclosure describes methods and systems configured for providing high speed access to network storage to compute nodes of corresponding compute sleds configured within corresponding streaming arrays, such as within a rack assembly.

It should be understood that the various embodiments defined herein may be combined or assembled into specific implementations using the various features disclosed herein. Thus, the examples provided are just some possible examples, without limitation to the various implementations that are possible by combining the various elements to define many more implementations. In some examples, some implementations may include fewer elements, without departing from the spirit of the disclosed or equivalent implementations.

Embodiments of the present disclosure may be practiced with various computer system configurations including hand-held devices, microprocessor systems, microprocessor-based or programmable consumer electronics, minicomputers, mainframe computers and the like. Embodiments of the present disclosure can also be practiced in distributed computing environments where tasks are performed by remote processing devices that are linked through a wire-based or wireless network.

With the above embodiments in mind, it should be understood that embodiments of the present disclosure can employ various computer-implemented operations involving data stored in computer systems. These operations are those requiring physical manipulation of physical quantities. Any of the operations described herein that form part of embodiments of the present disclosure are useful machine operations. Embodiments of the disclosure also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The disclosure can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing disclosure has been described in some detail for purposes of clarity of understanding, it will be apparent that certain changes and modifications can be practiced within the scope of the appended claims. Accordingly, the present embodiments are to be considered as illustrative and not restrictive, and embodiments of the present disclosure is not to be limited to the details given herein, but may be modified within the scope and equivalents of the appended claims.

What is claimed is:

1. A compute sled comprising:
   a plurality of compute nodes, wherein each of the plurality of compute nodes includes one or more Peripheral Component Interconnect Express (PCIe) lanes and one or more universal asynchronous receiver transmitter (UART) connections configured for transmitting and receiving serial data;
   a sled level PCIe switch electrically coupled to the plurality of compute nodes, the sled level PCIe switch including a plurality of incoming lanes and a plurality of outgoing lanes,
   wherein the plurality of incoming lanes is greater than the plurality of outgoing lanes,
   wherein the one or more PCIe lanes of the each of the plurality of compute nodes are electrically coupled to the plurality of incoming lanes,
   wherein the plurality of outgoing lanes is electrically coupled to network storage via an array-level PCIe switch; and
   a board management controller (BMC) electrically coupled to the one or more UART connections of the each of the plurality of compute nodes, the BMC configured for management of one or more components of the each of the plurality of compute nodes using a plurality of UART signals delivered over the one or more UART connections to the each of the plurality of compute nodes, wherein the one or more UART connections is independent of the one or more PCIe lanes for the each of the plurality of compute nodes.

2. The compute sled of claim 1, further comprising:
   an Ethernet network interface configured to provide network interfacing to an Ethernet fabric,
   wherein the Ethernet fabric communicatively couples the plurality of compute nodes to the network storage via a network switch.

3. The compute sled of claim 2,
   wherein the Ethernet network interface is electrically coupled to one or more of the plurality of outgoing lanes from the sled level PCIe switch to allow the each of the plurality of compute nodes to communicate with the sled level PCIe switch.

4. The compute sled of claim 1,
   wherein the BMC is electrically coupled to the sled level PCIe switch.

5. The compute sled of claim 4,
   wherein one of the plurality of outgoing lanes of the sled level PCIe switch is dedicated to electrically coupling the BMC to the sled-level PCIe switch.

6. The compute sled of claim 1, further comprising:
   a streaming array including a plurality of compute sleds, wherein each compute sled of the plurality of compute sleds includes one or more compute nodes;
   a network storage of the streaming array; and a PCIe fabric of the streaming array configured to provide direct access to the network storage of the streaming array from the one or more compute nodes of the each compute sled of the plurality of compute sleds of the streaming array, the PCIe fabric of the streaming array including one or more array-level PCIe switches directly coupling each of the one or more compute nodes of the each compute sled of the plurality of compute sleds of the streaming array to the network storage of the streaming spray via a corresponding sled level PCIe switch.

7. The compute sled of claim 1, further comprising:
a power interposer electrically coupled to the plurality of compute nodes and configured for providing a plurality of power signals,
wherein the power interposer is electrically coupled to a power bus bar providing power.

8. The compute sled of claim 7, further comprising:
a general purpose input/output connection between the BMC to the power interposer,
wherein the BMC is configured to a power control signal to the power interposer for controlling power delivered to a compute node.

9. The compute sled of claim 1, wherein the sled level PCIe switch includes:
a plurality of PCIe connectors electrically coupled to the plurality of compute nodes via corresponding connection interfaces,
wherein at least one of the plurality of outgoing lanes of the sled-level PCIe switch is dedicated for electrically coupling the plurality of compute nodes of the compute sled to an array management server.

10. The compute sled of claim 9, wherein the sled-level PCIe switch includes:
a plurality of UART connectors electrically coupled to a plurality of UART interfaces of the plurality of compute nodes;
a UART/GPIO controller electrically coupled to the plurality of UART connectors for communicating management control signals from the array management server to the plurality of compute nodes,
wherein the UART/GPIO controller is electrically coupled to a general purpose input/output connector for communicating power signals to a power interposer.

11. The compute sled of claim 1, wherein each compute node of the plurality of compute nodes is configured for executing one or more instances of a plurality of gaming applications.

12. The compute sled of claim 1,
wherein the network storage stores read-only game content of a gaming application, such that the read-only game content may be shared between compute instances executing the gaming application on one or more compute nodes of the plurality of compute sleds.

* * * * *